United States Patent
Hush et al.

(10) Patent No.: US 10,210,911 B2
(45) Date of Patent: Feb. 19, 2019

(54) APPARATUSES AND METHODS FOR PERFORMING LOGICAL OPERATIONS USING SENSING CIRCUITRY IN A MEMORY DEVICE

(71) Applicant: Micron Technology, Inc., Boise, ID (US)

(72) Inventors: Glen E. Hush, Boise, ID (US); Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/692,003

(22) Filed: Aug. 31, 2017

(65) Prior Publication Data

US 2017/0365299 A1    Dec. 21, 2017

Related U.S. Application Data

(63) Continuation of application No. 14/725,956, filed on May 29, 2015, now Pat. No. 9,786,335.

(Continued)

(51) Int. Cl.
*G11C 7/00* (2006.01)
*G11C 7/10* (2006.01)
(Continued)

(52) U.S. Cl.
CPC .................. *G11C 7/00* (2013.01); *G11C 7/10* (2013.01); *G11C 7/1006* (2013.01);
(Continued)

(58) Field of Classification Search
CPC ........... G11C 7/00; G11C 7/10; G11C 7/1012; G11C 7/1006; G11C 11/4093; G11C 11/4091; G11C 11/1673; G11C 7/065
See application file for complete search history.

(56) References Cited

U.S. PATENT DOCUMENTS 4,380,046 A    4/1983 Fung
4,435,792 A    3/1984 Bechtolsheim
(Continued)

FOREIGN PATENT DOCUMENTS

CN    102141905    8/2011
EP    0214718    3/1987
(Continued)

OTHER PUBLICATIONS

Pagiamtzis, Kostas, "Content-Addressable Memory Introduction", Jun. 25, 2007, (6 pgs.), retrieved from: http://www.pagiamtzis.com/cam/camintro.
(Continued)

*Primary Examiner* — Ajay Ojha
(74) *Attorney, Agent, or Firm* — Brooks, Cameron & Huebsch, PLLC

(57) ABSTRACT

The present disclosure includes apparatuses and methods related to performing logical operations using sensing circuitry. An example apparatus comprises an array of memory cells and sensing circuitry coupled to the array. The sensing circuitry includes a sense amplifier coupled to a pair of complementary sense lines, and a compute component coupled to the sense amplifier. The compute component includes a dynamic latch. The sensing circuitry is configured to perform a logical operation and initially store the result in the sense amplifier.

19 Claims, 18 Drawing Sheets

Related U.S. Application Data

(60) Provisional application No. 62/008,023, filed on Jun. 5, 2014.

(51) Int. Cl.
*G11C 11/4091* (2006.01)
*G11C 11/4093* (2006.01)
*G11C 11/16* (2006.01)
*G11C 7/06* (2006.01)

(52) U.S. Cl.
CPC ........ *G11C 7/1012* (2013.01); *G11C 11/4091* (2013.01); *G11C 11/4093* (2013.01); *G11C 7/065* (2013.01); *G11C 11/1673* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |

(56) References Cited

U.S. PATENT DOCUMENTS

| | | | |
|---|---|---|---|
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lad et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0329069 A1* | 12/2010 | Ito ..................... G11C 8/08 365/230.06 |
| 2010/0332895 A1 | 12/2010 | Billing et al. |
| 2011/0032778 A1* | 2/2011 | Iwai ................ G11C 11/4076 365/189.16 |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anhalt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1* | 9/2014 | Muralimanohar ... G11C 19/188 365/189.02 |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

(56) References Cited

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al, "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory As a Programmable Logic Device," filed Feb. 22, 2013, (30 pgs.).
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Office Action for related Taiwan Patent Application No. 104118423, dated Aug. 22, 2016, 10 pages.

\* cited by examiner

APPARATUSES AND METHODS FOR PERFORMING LOGICAL OPERATIONS USING SENSING CIRCUITRY IN A MEMORY DEVICE

PRIORITY INFORMATION

This application is a Continuation of U.S. application Ser. No. 14/725,956, filed May 29, 2015, which claims benefit of priority under 35 U.S.C. 119(e) to U.S. Provisional Application No. 62/008,023, filed Jun. 5, 2014, the contents of which are incorporated herein by reference.

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing. However, such PIM devices may have various drawbacks such as an increased chip size. Moreover, such PIM devices may still consume undesirable amounts of power in association with performing logical operations (e.g., compute functions).

DETAILED DESCRIPTION

Figure 1:
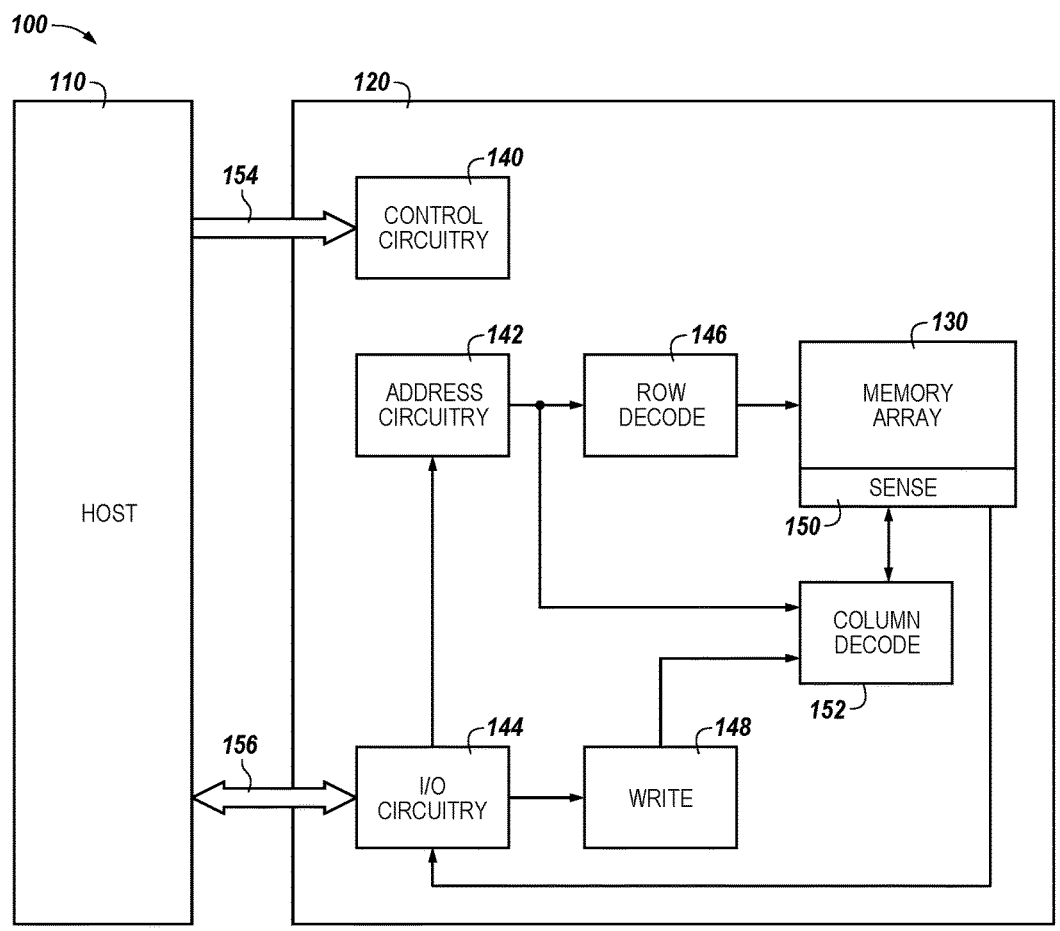
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells and sensing circuitry coupled to the array. The sensing circuitry includes a sense amplifier coupled to a pair of complementary sense lines, and a compute component coupled to the sense amplifier. The compute component includes a dynamic latch. The sensing circuitry is configured to perform a logical operation and initially store the result in the sense amplifier.

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

Examples of the sensing circuitry 150 are described further below. For instance, in a number of embodiments, the sensing circuitry 150 can comprise a number of sense amplifiers (e.g., sense amplifier 206 shown in FIG. 2 or sense amplifier 506 shown in FIG. 5) and a number of compute components (e.g., compute component 231-1 shown in FIG. 2), which can be used to perform logical operations (e.g., on data associated with complementary data lines). The sense amplifier can comprise a static latch, for example, which can be referred to herein as the primary latch. The compute component 231-1 can comprise a dynamic and/or static latch, for example, which can be referred to herein as the secondary latch, and which can serve as, and be referred to as, an accumulator.

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on control circuitry 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
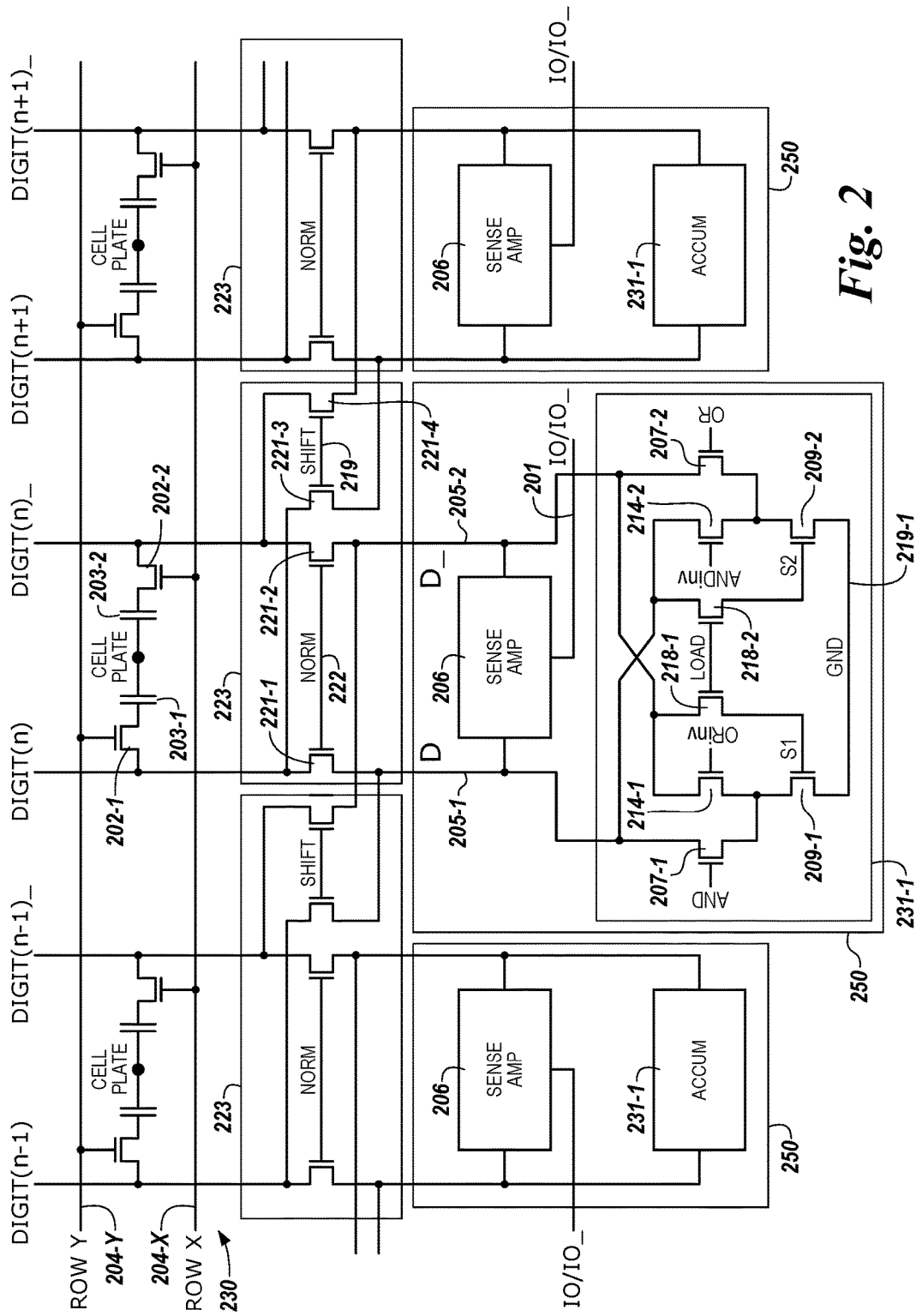
FIG. 2 is a schematic diagram illustrating sensing circuitry in accordance with a number of embodiments of the present disclosure.

FIG. 2 is a schematic diagram illustrating sensing circuitry in accordance with a number of embodiments of the present disclosure. A memory cell comprises a storage element (e.g., capacitor) and an access device (e.g., transistor). For instance, transistor 202-1 and capacitor 203-1 comprises a memory cell, and transistor 202-2 and capacitor 203-2 comprises a memory cell, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-X. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-Y. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231-1 corresponding to respective columns of memory cells (e.g., coupled to respective pairs of complementary data lines). The sensing circuitry 250 can correspond to sensing circuitry 150 shown in FIG. 1, for example. The sense amplifier 206 can be a sense amplifier such as sense amplifier 506 described below in association with FIG. 5. The sense amplifier 206 can be operated to determine a data value (e.g., logic state) stored in a selected memory cell. The sense amplifier 206 can comprise a cross coupled latch, which can be referred to herein as a primary latch. Embodiments are not limited to the example sense amplifier 206. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

As described further below, in a number of embodiments, the sensing circuitry (e.g., sense amplifier 206 and compute component 231) can be operated to perform a logical operation using a dynamic latch of the compute component 231-1 and store the result in the sense amplifier 206 without transferring data from the sensing circuitry via an I/O line (e.g., without performing a data line address access via activation of a column decode signal, for instance).

As used herein, a dynamic latch refers to a latch that relies on capacitance of transistors (e.g., gates) or other structures to maintain a particular data state stored as voltages on output nodes. A dynamic latch can be set/reset by selectively charging/discharging the capacitance. As such, the data state stored as voltages on the output nodes of the dynamic latch may remain valid only for a certain period of time. In contrast, a latch other than a dynamic latch (e.g., a static latch such as a cross-coupled latch) can retain its output level as long as power is provided and therefore can be stable over long periods of time. A dynamic latch can operate faster, consume less power, and/or be of smaller physical size compared to a static latch. One reason using a dynamic latch in the sensing circuitry 250 consumes less power than previous approaches is because loading the dynamic latch of the compute component 231-1 does not necessitate "overpowering" a cross-coupled latch (e.g., a "jam latch").

According to various embodiments of the present disclosure, a dynamic latch is used in an accumulator in performing logical operations in association with a sense amplifier ("sense amp"). The sense amplifier and accumulator are configured to have a result of the logical operation be initially stored in the sense amp. A data value (which may, or may not, be used in the logical operation) can remain unchanged in the accumulator. Benefits of having a logical operation result initially stored in a sense amplifier rather than the accumulator are discussed further below.

Performance of logical operations (e.g., Boolean logical functions involving data values) is fundamental and commonly used. Boolean logic functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

As shown in FIG. 2, the sense amplifier 206 and the compute component 231-1 can be coupled to the array 230 via shift circuitry 223. In this example, the shift circuitry 223 comprises a pair of isolation devices 221-1 and 221-2 (e.g., isolation transistors 221-1 and 221-2) coupled to data lines 205-1 (D) and 205-2 (D_), respectively). The isolation transistors 221-1 and 221-2 are coupled to a control signal 222 (NORM) that, when activated, enables (e.g., turns on) the isolation transistors 221-1 and 221-2 to couple the corresponding sense amplifier 206 and compute component 231-1 to a corresponding column of memory cells (e.g., to a corresponding pair of complementary data lines 205-1 (D) and 205-2 (D_)). According to various embodiments, conduction of isolation transistors 221-1 and 221-2 can be referred to as a "normal" configuration of the shift circuitry 223.

In the example illustrated in FIG. 2, the shift circuitry 223 includes another (e.g., a second) pair of isolation devices (e.g., transistors 221-3 and 221-4) coupled to a complementary control signal 219 (SHIFT), which can be activated, for example, when NORM is deactivated. The isolation transistors 221-3 and 221-4 can be operated (e.g., via control signal 219) such that a particular sense amplifier 206 and compute component 231-1 are coupled to a different pair of complementary data lines (e.g., a pair of complementary data lines different than the pair of complementary data lines to which isolation transistors 221-1 and 221-2 couple the particular sense amplifier 206 and compute component 231), or can couple a particular sense amplifier 206 and compute component 231-1 to another memory array (and isolate the particular sense amplifier 206 and compute component 231-1 from a first memory array). According to various embodiments, the shift circuitry 223 can be arranged as a portion of (e.g., within) the sense amplifier 206, for instance.

Although the shift circuitry 223 shown in FIG. 2 includes isolation transistors 221-1 and 221-2 used to couple particular sensing circuitry 250 (e.g., a particular sense amplifier 206 and corresponding compute component 231) to a particular pair of complementary data lines 205-1 (D) and 205-2 (D_) (e.g., DIGIT(n) and DIGIT(n)_) and isolation transistors 221-3 and 221-4 are arranged to couple the particular sensing circuitry 250 to an adjacent pair of complementary data lines in one particular direction (e.g., adjacent data lines DIGIT(n+1) and DIGIT(n+1)_ shown to the right in FIG. 2), embodiments of the present disclosure are not so limited. For instance, shift circuitry can include isolation transistors 221-1 and 221-2 used to couple particular sensing circuitry to a particular pair of complementary data lines (e.g., DIGIT(n) and DIGIT(n)_ and isolation transistors 221-3 and 221-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 2).

Embodiments of the present disclosure are not limited to the configuration of shift circuitry 223 shown in FIG. 2. Also, embodiments of the present disclosure can be configured as otherwise shown in FIG. 2 but without the shift circuitry 223. That is, shift circuitry 223 is optional. In a number of embodiments, shift circuitry such as that shown in FIG. 2 can be operated (e.g., in conjunction with sense amplifiers 206 and compute components 231) in association with performing compute functions such as adding and subtracting functions without transferring data out of the sensing circuitry 250 via an I/O line (e.g., local I/O line 201 (IO/IO_)), for instance.

Although shown in FIG. 1 but not shown in FIG. 2, each column of memory cells can be coupled to a column decode line that can be enabled to transfer, via local I/O line 201, a data value from a corresponding sense amplifier 206 and/or compute component 231-1 to a control component external to the array such as an external processing resource (e.g., host processor and/or other functional unit circuitry). The column decode line can be coupled to a column decoder (e.g., column decoder 152 shown in FIG. 1). However, as described herein, in a number of embodiments, data need not be transferred via such I/O lines (e.g., I/O line 201) to perform logical operations in accordance with embodiments of the present disclosure. In a number of embodiments, shift circuitry such as that shown in FIG. 2 can be operated (e.g., in conjunction with sense amplifiers 206 and compute components 231) in performing compute functions such as adding and subtracting functions without transferring data to a control component external to the array, for instance.

In the example illustrated in FIG. 2, the compute component 231-1 includes eight transistors (e.g., four transistors per complementary data line). The transistors are formed on pitch with the sense amplifier 206 and with the memory cells of the array 230. The compute component 231-1 comprises a dynamic latch that can be referred to as a secondary latch, which can operate as (e.g., serve as) an accumulator in performing logical operations. As such, the secondary latch of the compute component 231-1 may be referred to as the accumulator of the compute component 231-1. The compute component 231-1 is coupled to the sense amplifier 206 via the data lines 205-1 (D) and D_205-2 as shown in FIG. 2. In this example, the transistors of compute component 231-1 are all n-channel transistors (e.g., NMOS transistors); however, embodiments are not so limited.

In this example, the compute component 231-1 includes a first pass transistor 207-1 having a first source/drain region directly coupled (e.g., connected) to data line 205-1 (D), which is also directly coupled to a first source/drain region of a load transistor 218-2 and a first source/drain region of an invert transistor 214-2. As used herein, "directly coupled" intends coupled without an intervening component. A second pass transistor 207-2 has a first source/drain region directly coupled to data line 205-2, which is also directly coupled to a first source/drain region of a load transistor 218-1 and a first source/drain region of an invert transistor 214-1.

The gates of load transistors 218-1 and 218-2 are commonly coupled together and to a LOAD control signal. A second source/drain region of load transistor 218-1 is directly coupled to a gate of transistor 209-1 (e.g., "dynamic latch transistor") at a common node of the latch (e.g., node S1 of the dynamic latch). A second source/drain region of load transistor 218-2 is directly coupled to a gate of transistor 209-2 at the complementary common node of the latch (e.g., node S2 of the dynamic latch).

A second source/drain region of inverting transistor 214-1 is directly coupled to a first source/drain region of transistor 209-1 and to a second source/drain region of pass transistor 207-1. A second source/drain region of inverting transistor 214-2 is directly coupled to a first source/drain region of transistor 209-2 and to a second source/drain region of pass transistor 207-2. A second source/drain region of transistors 209-1 and 209-2 are commonly coupled to a reference signal (e.g., ground (GND)). A gate of pass transistor 207-1 is coupled to a control signal AND. A gate of pass transistor 207-2 is coupled to a control signal OR. A gate of invert transistor 214-1 is coupled to a control signal ORinv. A gate of invert transistor 214-2 is coupled to a control signal ANDinv.

The dynamic latch of compute component 231-1 shown in FIG. 2 can operate as an accumulator (and may be referred to as such) storing data dynamically on nodes S1 and S2. Activating the LOAD control signal enables load transistors 218-1 and 218-2 (e.g., causes them to conduct) and thereby loads complementary data onto nodes S1 and S2, when load transistors 218-1 and 218-2 are conducting (e.g., enabled via the LOAD control signal). Note however that the voltage on data line 205-2 (D_) is coupled to node S1 and the voltage on data line 205-1 (D) is coupled to node S2. The LOAD control signal can be elevated to a voltage greater than $V_{DD}$ to pass a full $V_{DD}$ level to nodes S1/S2. However, elevating the LOAD control signal to a voltage greater than $V_{DD}$ is optional, and functionality of the circuit shown in FIG. 2 is not contingent on the LOAD control signal being elevated to a voltage greater than $V_{DD}$.

The sensing circuitry 250 is configured to perform logical operations on data values stored in the array of memory cells with the result (e.g., resultant data value) being stored (e.g., residing) in the sense amplifier (e.g., 206). The logical operations (e.g., AND, OR, etc.) can be performed on data values stored in cells coupled to different access lines (e.g., Row X and Row Y) and to one or more pairs of complementary data lines (e.g., 205-1 and 205-2).

Operation of the sensing circuitry 250 to perform AND, OR, and NOT (e.g., invert) operations is described further below, as is operation of the shift circuitry 223 to accomplish a SHIFT between pairs of complementary data lines. While operations are described below involving one or two data values, logical operations involving a plurality of data values can be accomplished without having to transfer data to an external arithmetic logic unit (ALU) or other processing resource outside of the sensing circuitry 250, which may only operate on 32/64/128 bits at a time. For example, assuming 32 word lines and 16K data lines (e.g., bit lines), logical operations involving 16K ANDs/ORs of 32-bit data values can be implemented utilizing the sensing circuitry associated with a plurality of data lines without transferring data out of the sensing circuitry.

The functionality of the sensing circuitry of FIG. 2 is described below and summarized in Table 1 below. Initially storing the result of a particular logical operation in the sense amplifier (e.g., in a primary latch of sense amplifier 206) can provide improved versatility as compared to previous approaches in which the result may initially reside in a secondary latch (e.g., accumulator) of a compute component (e.g., 231-1), and then be subsequently transferred to the sense amp, for instance.

TABLE 1

| Operation | Accumulator | Sense Amp |
| --- | --- | --- |
| AND | Unchanged | Result |
| OR | Unchanged | Result |
| NOT | Unchanged | Result |
| SHIFT | Unchanged | Shifted Data |

Initially storing the result of a particular operation in the sense amplifier (e.g., without having to perform an additional operation to move the result from the accumulator to the sense amp) is advantageous because, for instance, the result can be written to a row (of the array of memory cells)

or back into the accumulator without performing a precharge cycle (e.g., on the complementary data lines 205-1 (D) and/or 205-2 (D_)). A precharge cycle can involve precharging complementary data lines to a predetermined voltage level (e.g., $V_{DD}/2$) before/after performing an operation using the complementary data lines. Reducing the number of precharge cycles can increase the speed of and/or reduce the power associated with performing various operations. As an example, in association with performing an AND operation on a pair of data values, the sensing circuitry shown in FIG. 2 consumes power for only one of the four possible data combinations shown in Table 2 below. For instance, if an AND is performed on a data value residing in the accumulator of the compute component (e.g., 231-1) and a data value stored in a memory cell coupled to a particular access line (e.g., Row X), then current (e.g., about 60 mA) is drawn only for the situation in which the accumulator stores a "0" and the memory cell stores a "1," as shown in Table 2.

TABLE 2

| Accumulator | Row | AND | Icc |
|---|---|---|---|
| 0 | 0 | 0 | 0 |
| 0 | 1 | 0 | Approx. 60 mA |
| 1 | 0 | 0 | 0 |
| 1 | 1 | 1 | 0 |

Figure 5:
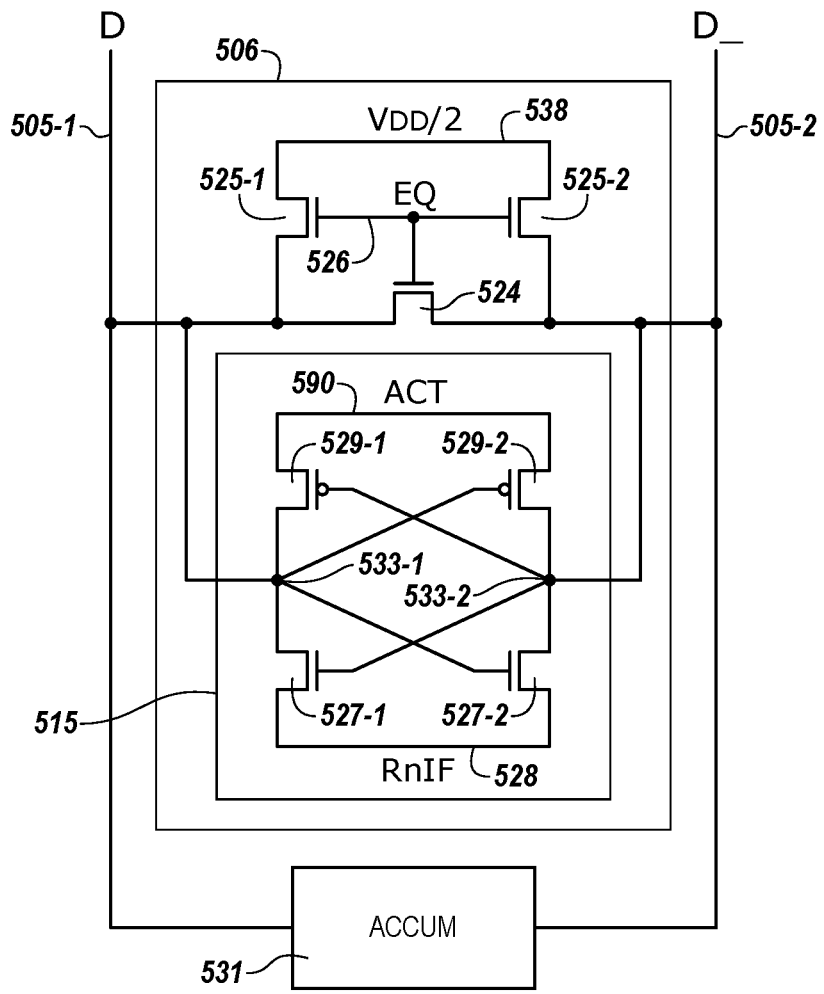
FIG. 5 is a schematic diagram illustrating a portion of sensing circuitry in accordance with a number of embodiments of the present disclosure.

Prior to performing a logical operation, an equilibrate operation can occur such that the complementary data lines D and D_ are shorted together at an equilibration voltage (e.g., $V_{DD}/2$), as is described in detail with respect to sense amplifier 506 illustrated in FIG. 5. An initial operation phase associated with performing an AND or an OR operation on a first data value and a second data value stored in memory cells coupled to different access lines (e.g., 204-X and 204-Y) can include loading the first data value into the accumulator of compute component 231-1.

Figure 3:
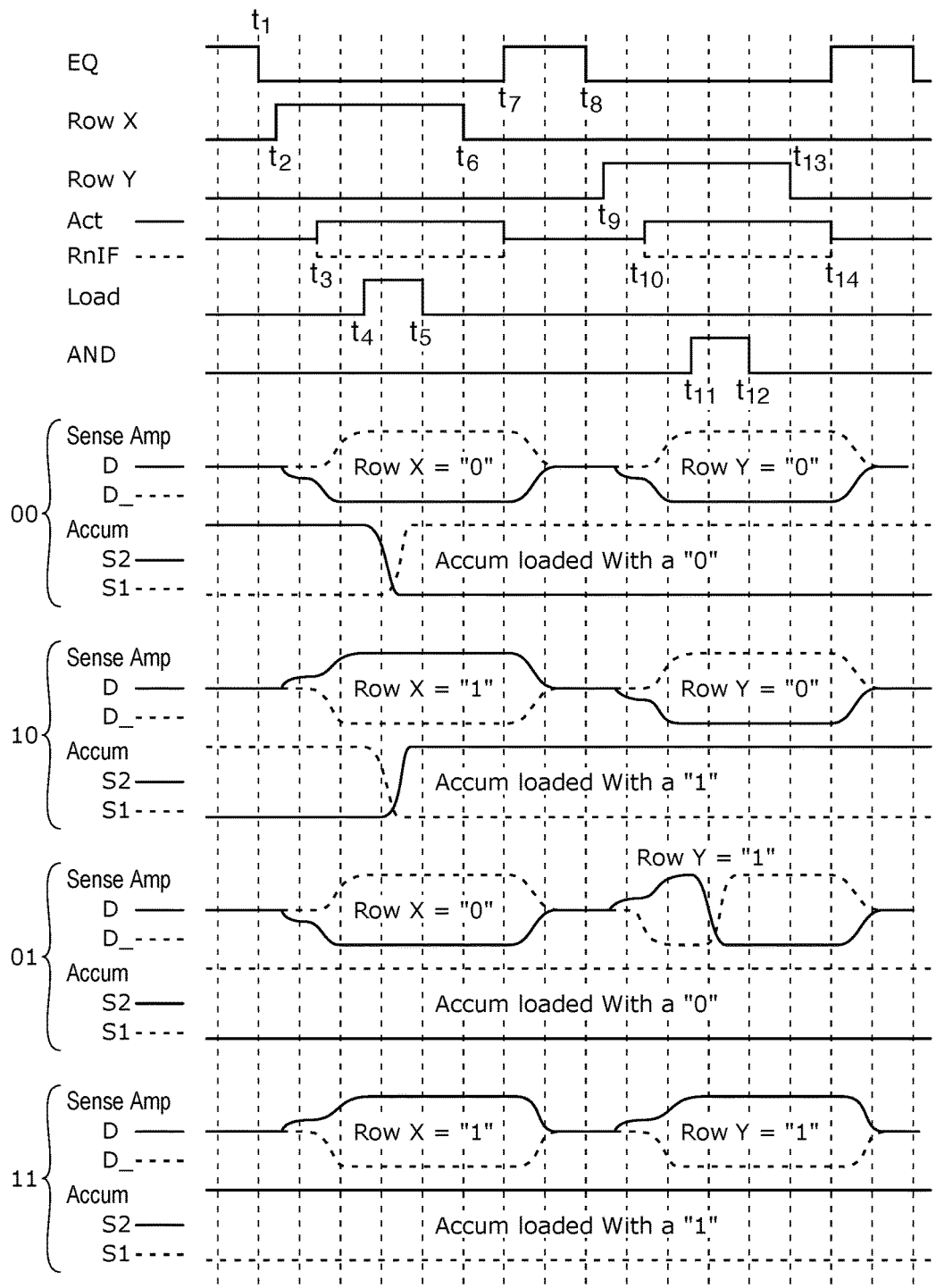
FIG. 3 illustrates a timing diagram associated with performing a number of logical operations using sensing circuitry in accordance with a number of embodiments of the present disclosure.

FIG. 3 illustrates a timing diagram associated with performing a number of logical operations using sensing circuitry in accordance with a number of embodiments of the present disclosure. FIG. 3 illustrates a timing diagram associated with initiating an AND logical operation after starting to load the second operand (e.g., Row Y data value) into the sense amplifier. FIG. 3 illustrates the sense amplifier and accumulator signals for various combinations of first and second operand data values. FIG. 3 shows the respective sense amplifier and accumulator signals corresponding to each combination of Row X data value and Row Y data value in each set. The particular timing diagram signals are discussed below with respect to the pseudo code associated with an AND operation of the circuit shown in FIG. 2.

An example of pseudo code associated with loading (e.g., copying) a first data value stored in a cell coupled to row 204-X into the accumulator can be summarized as follows:
Copy Row X into the Accumulator:
Deactivate EQ
Open Row X
Fire Sense Amps (after which Row X data resides in the sense amps)
Activate LOAD (sense amplifier data (Row X) is transferred to nodes S1 and S2 of the Accumulator and resides there dynamically)
Deactivate LOAD
Close Row X
Precharge
In the pseudo code above, "Deactivate EQ" indicates that an equilibration signal (EQ signal shown in FIG. 3) corresponding to the sense amplifier 206 is disabled at $t_1$ as shown in FIG. 3 (e.g., such that the complementary data lines (e.g., 205-1 (D) and 205-2 (D_) are no longer shorted to $V_{DD}/2$). After equilibration is deactivated, a selected row (e.g., ROW X) is enabled (e.g., selected, opened such as by activating a signal to select a particular row) as indicated by "Open Row X" in the pseudo code and shown at $t_2$ for signal Row X in FIG. 3. When the voltage signal applied to ROW X reaches the threshold voltage (Vt) of the access transistor (e.g., 202-2) corresponding to the selected cell, the access transistor turns on and couples the data line (e.g., 205-2 (D_)) to the selected cell (e.g., to capacitor 203-2) which creates a differential voltage signal between the data lines.

After Row X is opened, in the pseudo code above, "Fire Sense Amps" indicates that the sense amplifier 206 is enabled to set the primary latch and subsequently disabled. For example, as shown at $t_3$ in FIG. 3, the ACT positive control signal (e.g., 590 shown in FIG. 5) goes high and the RnIF negative control signal (e.g., 528 shown in FIG. 5) goes low, which amplifies the differential signal between 205-1 (D) and D_ 20502, resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). The sensed data value is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

The four sets of possible Sense amplifier and Accumulator signals illustrated in FIG. 3 (e.g., one for each combination of Row X and Row Y data values) shows the behavior of signals on data lines D and D_. The Row X data value is stored in the primary latch of the sense amp. It should be noted that FIG. 2 shows that the memory cell including storage element 202-2, corresponding to Row X, is coupled to the complementary data line D_, while the memory cell including storage element 202-1, corresponding to Row Y, is coupled to data line D. However, as can be seen in FIG. 2, the charge stored in memory cell 202-2 (corresponding to Row X) corresponding to a "0" data value causes the voltage on data line D_ (to which memory cell 202-2 is coupled) to go high and the charge stored in memory cell 202-2 corresponding to a "1" data value causes the voltage on data line D_ to go low, which is opposite correspondence between data states and charge stored in memory cell 202-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 3, causing load transistors 218-1 and 218-2 to conduct. In this manner, activating the LOAD control signal enables the dynamic latch (e.g., secondary latch in the accumulator) of the compute component 23-1. The sensed data value stored in the sense amplifier 206 is transferred (e.g., copied) to the dynamic latch so as to be dynamically stored on nodes S1 and S2. As shown for each of the four sets of possible Sense amplifier and Accumulator signals illustrated in FIG. 3, the behavior at S1 and S2 of the dynamic latch of the Accumulator indicates the secondary latch is loaded with the Row X data value. As shown in FIG. 3, the dynamic latch of the Accumulator may flip (e.g., see Accumulator signals for Row X="0" and Row Y="0" and for Row X="1" and Row Y="0"), or not flip (e.g., see Accumulator signals for Row X="0" and Row Y="1" and for Row X="1" and Row Y="1"), depending on the data value previously stored in the dynamic latch.

After setting the dynamic latch from the data values stored in the sense amplifier (and present on the data lines 205-1 (D) and 205-2 (D_), in the pseudo code above, "Deactivate LOAD" indicates that the LOAD control signal goes back low as shown at $t_5$ in FIG. 3 to cause the load transistors 218-1 and 218-2 to stop conducting and thereby isolate the dynamic latch from the complementary data lines. However, the data value remains dynamically stored in dynamic latch of the accumulator at nodes S1 and S2.

After storing the data value on the dynamic latch, the selected row (e.g., ROW X) is disabled (e.g., deselected, closed such as by deactivating a select signal for a particular row) as indicated by "Close Row X" and indicated at $t_6$ in FIG. 3, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above and shown in FIG. 3 by the EQ signal going high at $t_7$. As shown in each of the four sets of possible Sense amplifier and Accumulator signals illustrated in FIG. 3 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the dynamic latch of the accumulator 231-1) and the second data value (stored in a memory cell 202-1 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 202-2 coupled to Row X 204-X) and the second data value (e.g., the data value stored in the memory cell 202-1 coupled to Row Y 204-Y) are summarized below. Example pseudo code associated with "ANDing" the data values can include:

Deactivate EQ
Open Row Y
Fire Sense Amps (after which Row Y data resides in the sense amps)
Close Row Y
The result of the logic operation, in the next operation, will be placed on the sense amp, which will overwrite any row that is open.
Even when Row Y is closed, the sense amplifier still contains the Row Y data value.
Activate AND
This results in the sense amplifier being written to the value of the function (e.g., Row X AND Row Y)
If the accumulator contains a "0" (i.e., a voltage corresponding to a "0" on node S2 and a voltage corresponding to a "1" on node S1), the sense amplifier data is written to a "0"
If the accumulator contains a "1" (i.e., a voltage corresponding to a "1" on node S2 and a voltage corresponding to a "0" on node S1), the sense amplifier data remains unchanged (Row Y data)

This operation leaves the data in the accumulator unchanged.
Deactivate AND
Precharge In the pseudo code above, "Deactivate EQ" indicates that an equilibration signal corresponding to the sense amplifier 206 is disabled (e.g., such that the complementary data lines 205-1 (D) and 205-2 (D_) are no longer shorted to $V_{DD}/2$), which is illustrated in FIG. 3 at $t_9$. After equilibration is deactivated, a selected row (e.g., ROW Y) is enabled as indicated in the pseudo code above by "Open Row Y" and shown in FIG. 3 at $t_9$. When the voltage signal applied to ROW Y reaches the threshold voltage (Vt) of the access transistor (e.g., 202-1) corresponding to the selected cell, the access transistor turns on and couples the data line (e.g., D_ 205-1) to the selected cell (e.g., to capacitor 203-1) which creates a differential voltage signal between the data lines.

After Row Y is opened, in the pseudo code above, "Fire Sense Amps" indicates that the sense amplifier 206 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D) (and the voltage corresponding to the other logic state being on complementary data line 205-2 (D_)). As shown at $t_{10}$ in FIG. 3, the ACT positive control signal (e.g., 590 shown in FIG. 5) goes high and the RnIF negative control signal (e.g., 528 shown in FIG. 5) goes low to fire the sense amps. The sensed data value from memory cell 202-1 is stored in the primary latch of sense amplifier 206, as previously described. The dynamic latch still corresponds to the data value from memory cell 202-2 since the dynamic latch is unchanged.

After the second data value sensed from the memory cell 202-1 coupled to Row Y is stored in the primary latch of sense amplifier 206, in the pseudo code above, "Close Row Y" indicates that the selected row (e.g., ROW Y) can be disabled if it is not desired to store the result of the AND logical operation back in the memory cell corresponding to Row Y. However, FIG. 3 shows that Row Y is left open such that the result of the logical operation can be stored back in the memory cell corresponding to Row Y. Isolating the memory cell corresponding to Row Y can be accomplished by the access transistor turning off to decouple the selected cell 202-1 from the data line 205-1 (D). After the selected Row Y is configured (e.g., to isolate the memory cell or not isolate the memory cell), "Activate AND" in the pseudo code above indicates that the AND control signal goes high as shown in FIG. 3 at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231-1 and the second data value (e.g., Row Y) stored in the sense amplifier 206, if the dynamic latch of the accumulator 231-1 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 209-1 to conduct thereby coupling the sense amplifier 206 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 206. This operation leaves the data value in the accumulator unchanged (e.g., from Row X).

If the dynamic latch of the accumulator contains a "1" (e.g., from Row X), then the result of the AND operation depends on the data value stored in the sense amplifier 206 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 206 (e.g., from Row Y) is also a "0." The sensing circuitry 231-1 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206, "Deactivate AND" in the pseudo code above indicates that the AND control signal goes low as shown at $t_{12}$ in FIG. 3, causing pass transistor 207-1 to stop conducting to isolate the sense amplifier 206 (and data line 205-1 (D)) from ground. If not previously done, Row Y can be closed (as shown at $t_{13}$ in FIG. 3) and the sense amplifier can be disabled (as shown at $t_{14}$ in FIG. 3 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 3).

FIG. 3 shows, in the alternative, the behavior of voltage signals on the data lines (e.g., 205-1 (D) and 205-2 (D_) shown in FIG. 2) coupled to the sense amplifier (e.g., 206 shown in FIG. 2) and the behavior of voltage signals on nodes S1 and S1 of the dynamic latch of the compute component (e.g., 231-1 shown in FIG. 2) for an AND logical operation involving each of the possible combination of operands (e.g., Row X/Row Y data values 00, 10, 01, and 11).

Although the timing diagrams illustrated in FIG. 3 and the pseudo code described above indicate initiating the AND logical operation after starting to load the second operand (e.g., Row Y data value) into the sense amplifier, the circuit shown in FIG. 2 can be successfully operated by initiating the AND logical operation before starting to load the second operand (e.g., Row Y data value) into the sense amplifier, the details of which are described below and illustrated with respect to FIGS. 9, 10, and 11.

Figure 4:
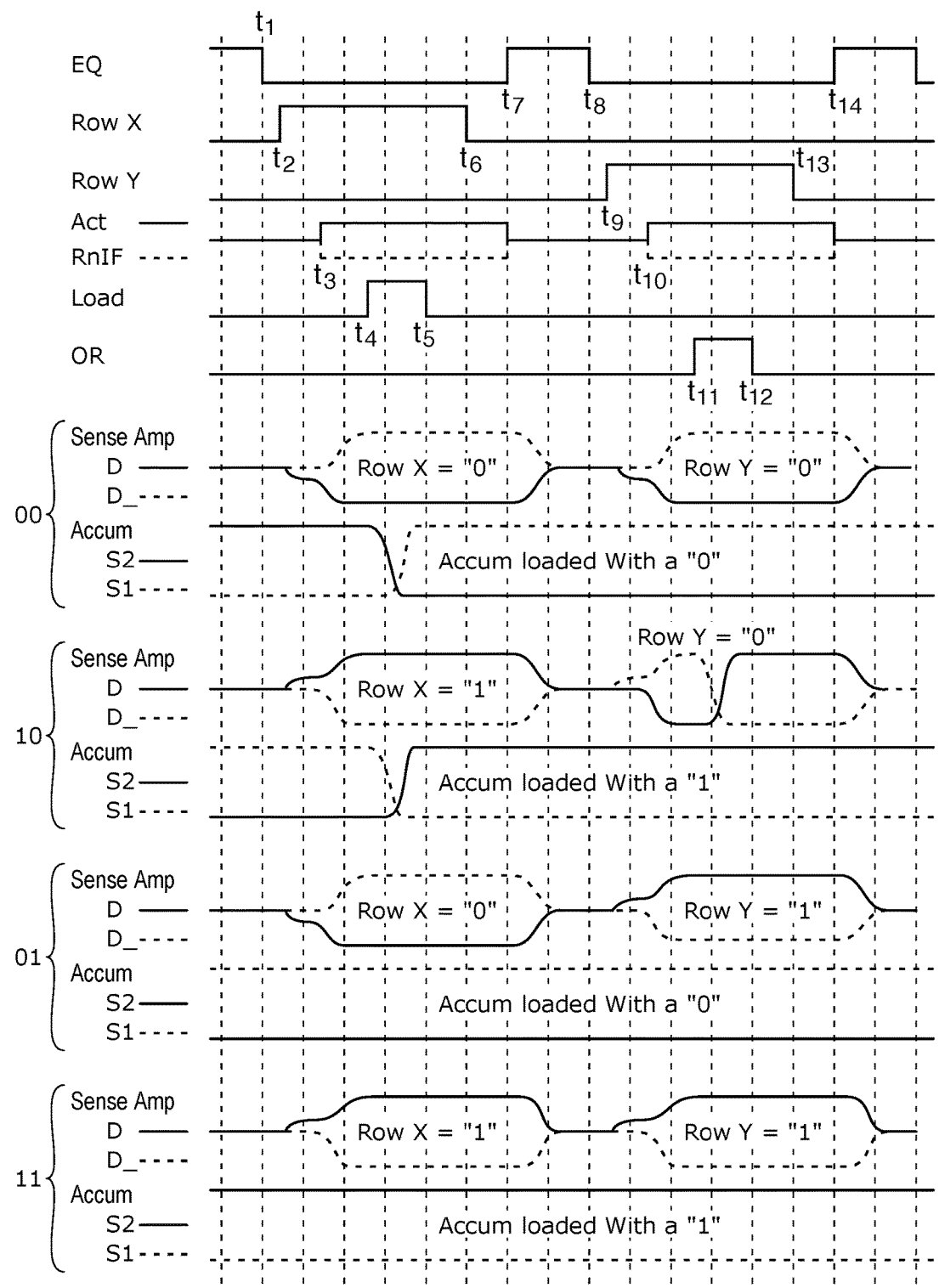
FIG. 4 illustrates a timing diagram associated with performing a number of logical operations using sensing circuitry in accordance with a number of embodiments of the present disclosure.

FIG. 4 illustrates a timing diagram associated with performing a number of logical operations using sensing circuitry in accordance with a number of embodiments of the present disclosure. FIG. 4 illustrates a timing diagram associated with initiating an OR logical operation after starting to load the second operand (e.g., Row Y data value) into the sense amplifier. FIG. 4 illustrates the sense amplifier and accumulator signals for various combinations of first and second operand data values. The particular timing diagram signals are discussed below with respect to the pseudo code associated with an AND logical operation of the circuit shown in FIG. 2.

A subsequent operation phase can alternately be associated with performing the OR operation on the first data value (now stored in the sense amplifier 206 and the dynamic latch of the accumulator 231-1) and the second data value (stored in a memory cell 202-1 coupled to Row Y 204-Y). The operations to load the Row X data into the sense amplifier and accumulator that were previously described with respect to times $t_1$-$t_7$ shown in FIG. 3 are not repeated with respect to FIG. 4. Example pseudo code associated with "ORing" the data values can include:

Deactivate EQ
Open Row Y
Fire Sense Amps (after which Row Y data resides in the sense amps)
Close Row Y
When Row Y is closed, the sense amplifier still contains the Row Y data value.
Activate OR
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data)
If the accumulator contains a "1" (i.e., a voltage corresponding to a "1" on node S2 and a voltage corresponding to a "0" on node S1), the sense amplifier data is written to a "1"
This operation leaves the data in the accumulator unchanged.
Deactivate OR
Precharge The "Deactivate EQ" (shown at $t_8$ in FIG. 4), "Open Row Y" (shown at $t_9$ in FIG. 4), "Fire Sense Amps" (shown at $t_{10}$ in FIG. 4), and "Close Row Y" (shown at $t_{13}$ in FIG. 4, and which may occur prior to initiating the particular logical function control signal), shown in the pseudo code above indicate the same functionality as previously described with respect to the AND operation pseudo code. Once the configuration of selected Row Y is appropriately configured (e.g., opened if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 4, which causes pass transistor 207-2 to conduct. In this manner, activating the OR control signal causes the value of the function (e.g., Row X OR Row Y) to be written to the sense amp.

With the first data value (e.g., Row X) stored in the dynamic latch of the accumulator 231-1 and the second data value (e.g., Row Y) stored in the sense amplifier 206, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206 (e.g., from Row Y). The result of the OR operation should be a "1" if the data value stored in the sense amplifier 206 (e.g., from Row Y) is a "1," but the result of the OR operation should be a "0" if the data value stored in the sense amplifier 206 (e.g., from Row Y) is also a "0." The sensing circuitry 231-1 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206 is not coupled to ground (either side), and the data value previously stored in the sense amplifier 206 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206 as a result of the OR operation when the dynamic latch of the accumulator contains a "1" regardless of the data value previously stored in the sense amp. This operation leaves the data in the accumulator unchanged. FIG. 4 shows, in the alternative, the behavior of voltage signals on the data lines (e.g., 205-1 (D) and 205-2 (D_) shown in FIG. 2) coupled to the sense amplifier (e.g., 206 shown in FIG. 2) and the behavior of voltage signals on nodes S1 and S2 of the dynamic latch of the compute component (e.g., 231-1 shown in FIG. 2) for an OR logical operation involving each of the possible combination of operands (e.g., Row X/Row Y data values 00, 10, 01, and 11).

After the result of the OR operation is initially stored in the sense amplifier 206, "Deactivate OR" in the pseudo code above indicates that the OR control signal goes low as shown at $t_{12}$ in FIG. 4, causing pass transistor 207-2 to stop conducting to isolate the sense amplifier 206 (and data line D 205-2) from ground. If not previously done, Row Y can be closed (as shown at $t_{13}$ in FIG. 4) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 4.

The sensing circuitry illustrated in FIG. 2 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 214-1 to conduct and activating the ANDinv control signal causes transistor 214-2 to conduct. In each case, asserting the appropriate inverted control signal can flip the sense amplifier and cause the result initially stored in the sense amplifier 206 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2 can perform a NOT (e.g., invert) operation by putting the non-inverted data value into the dynamic latch of the accumulator and using that data to invert the data value in the sense amplifier 206. As previously mentioned, activating the ORinv control signal causes transistor 214-1 to conduct and activating the ANDinv control signal causes transistor 214-2 to conduct. The ORinv and/or ANDinv control signals are used in implementing the NOT function, as described further below:

Copy Row X into the Accumulator
    Deactivate EQ
    Open Row X
    Fire Sense Amps (after which Row X data resides in the sense amps)
    Activate LOAD (sense amplifier data (Row X) is transferred to nodes S1 and S2 of the Accumulator and resides there dynamically
    Deactivate LOAD
    Activate ANDinv and ORinv (which puts the compliment data value on the data lines)
        This results in the data value in the sense amplifier being inverted (e.g., the sense amplifier latch is flipped)
        This operation leaves the data in the accumulator unchanged
    Deactivate ANDinv and ORinv
    Close Row X
    Precharge The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 206 and copied into the dynamic latch, a compliment version of the data value in the dynamic latch of the accumulator can be placed on the data line and thus transferred to the sense amplifier 206 by enabling and disabling the invert transistors (e.g., ANDinv and/or ORinv). This results in the sense amplifier 206 being flipped from the true data value that was previously stored in the sense amplifier to a compliment data value (e.g., inverted data value) stored in the sense amp. That is, a true or compliment version of the data value in the accumulator can be transferred to the sense amplifier by activating and deactivating ANDinv and/or ORinv. This operation leaves the data in the accumulator unchanged.

Because the sensing circuitry 250 shown in FIG. 2 initially stores the result of the AND, OR, and NOT logical operations in the sense amplifier 206 (e.g., on the sense amplifier nodes), these logical operation results can be communicated easily and quickly to any open row, any row opened after the logical operation is complete, and/or into the dynamic latch of the accumulator 231-1. The sense amplifier 206 and sequencing for the AND, OR, and/or NOT logical operations can also be interchanged by appropriate activation of the AND, OR, ANDinv, and/or ORinv control signals (and operation of corresponding transistors having a gate coupled to the particular control signal) before the sense amplifier 206 fires.

When performing logical operations in this manner, the sense amplifier 206 can be pre-seeded with a data value from the dynamic latch of the accumulator to reduce overall current utilized because the sense amps 206 are not at full rail voltages (e.g., supply voltage or ground/reference voltage) when accumulator function is copied to the sense amplifier 206. An operation sequence with a pre-seeded sense amplifier 206 either forces one of the data lines to the reference voltage (leaving the complementary data line at $V_{DD}/2$, or leaves the complementary data lines unchanged. The sense amplifier 206 pulls the respective data lines to full rails when the sense amplifier 206 fires. Using this sequence of operations will overwrite data in an open Row.

A SHIFT operation can be accomplished by multiplexing ("muxing") two neighboring data line complementary pairs using a traditional DRAM isolation (ISO) scheme. According to embodiments of the present disclosure, the shift circuitry 223 can be used for shifting data values stored in memory cells coupled to a particular pair of complementary data lines to the sensing circuitry 250 (e.g., sense amplifier 206) corresponding to a different pair of complementary data lines (e.g., such as a sense amplifier 206 corresponding to a left or right adjacent pair of complementary data lines. As used herein, a sense amplifier 206 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized as follows:

Deactivate Norm and Activate Shift
  Deactivate EQ
  Open Row X
  Fire Sense Amps (after which shifted Row X data resides in the sense amps)
  Activate Norm and Deactivate Shift
  Close Row X
  Precharge In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206 from the left adjacent pair of complementary data lines (e.g., on the memory array side of non-conducting isolation transistors 221-1 and 221-2 for the left adjacent pair of complementary data lines). Since Row X is still open, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift
  Deactivate EQ
  Open Row X
  Fire Sense Amps (after which Row X data resides in the sense amps)
  Deactivate Norm and Activate Shift
  Sense amplifier data (shifted left Row X) is transferred to Row X
  Close Row X
  Precharge In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 250 is stored in the sense amplifier 206.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still open, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^{\wedge}2$ or $4F^{\wedge}2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

FIG. 5 is a schematic diagram illustrating a portion of sensing circuitry in accordance with a number of embodiments of the present disclosure. The sensing circuitry shown in FIG. 5 comprises a sense amplifier 506 and a compute component 533. The compute component 533 can have various architectures such as those described above in association with FIG. 2 and as those described below in association with FIGS. 6-9, 12, 13, and 18. In a number of embodiments, the compute component comprises an accumulator having an associated dynamic latch, for instance. In a number of embodiments, a sense amplifier (e.g., 506) can comprise a number of transistors formed on pitch with the transistors of the corresponding compute component (e.g., 533) and/or the memory cells of an array (e.g., array 230 shown in FIG. 2) to which they are coupled, which may conform to a particular feature size (e.g., $4F^2$, $6F^2$, etc.).

As described further below, the sense amplifier 506 can, in conjunction with the compute component 533, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

In the example illustrated in FIG. 5, the circuitry corresponding to sense amplifier 506 comprises a latch 515 including four transistors coupled to a pair of complementary data lines D 505-1 and D_ 505-2. However, embodiments are not limited to this example. The latch 515 can be a cross coupled latch (e.g., gates of a pair of transistors, such as n-channel transistors (e.g., NMOS transistors) 527-1 and 527-2 are cross coupled with the gates of another pair of transistors, such as p-channel transistors (e.g., PMOS transistors) 529-1 and 529-2). As described further herein, the cross coupled latch 415 comprising transistors 527-1, 527-2, 529-1, and 529-2 can be referred to as a primary latch.

The voltages or currents on the respective data lines D and D_ can be provided to the respective latch inputs 533-1 and 533-2 of the cross coupled latch 515 (e.g., the input of the secondary latch). In this example, the latch input 533-1 is coupled to a first source/drain region of transistors 527-1 and 529-1 as well as to the gates of transistors 527-2 and 529-2. Similarly, the latch input 533-2 can be coupled to a first source/drain region of transistors 527-2 and 529-2 as well as to the gates of transistors 527-1 and 529-1. The compute component 533 (e.g., accumulator) can be coupled to latch inputs 533-1 and 533-2 of the cross coupled latch 515 as shown; however, embodiments are not limited to the example shown in FIG. 5.

In this example, a second source/drain region of transistor 527-1 and 527-2 is commonly coupled to a negative control signal 528 (RnIF). A second source/drain region of transistors 529-1 and 529-2 is commonly coupled to a positive control signal 590 (ACT). The ACT signal 590 can be a supply voltage (e.g., $V_{DD}$) and the RnIF signal can be a reference voltage (e.g., ground). Activating signals 528 and 590 enables the cross coupled latch 515.

The enabled cross coupled latch 515 operates to amplify a differential voltage between latch input 533-1 (e.g., first common node) and latch input 533-2 (e.g., second common node) such that latch input 533-1 is driven to one of the ACT signal voltage and the RnIF signal voltage (e.g., to one of $V_{DD}$ and ground), and latch input 533-2 is driven to the other of the ACT signal voltage and the RnIF signal voltage.

The sense amplifier 506 can also include circuitry configured to equilibrate the data lines D and D_ (e.g., in association with preparing the sense amplifier for a sensing operation). In this example, the equilibration circuitry comprises a transistor 524 having a first source/drain region coupled to a first source/drain region of transistor 525-1 and data line D 505-1. A second source/drain region of transistor 524 can be coupled to a first source/drain region of transistor 525-2 and data line D_ 505-2. A gate of transistor 524 can be coupled to gates of transistors 525-1 and 525-2.

The second source drain regions of transistors 525-1 and 525-2 are coupled to an equilibration voltage 538 (e.g., $V_{DD}/2$), which can be equal to $V_{DD}/2$, where $V_{DD}$ is a supply voltage associated with the array. The gates of transistors 524, 525-1, and 525-2 can be coupled to control signal 525 (EQ). As such, activating EQ enables the transistors 524, 525-1, and 525-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

Figure 6:
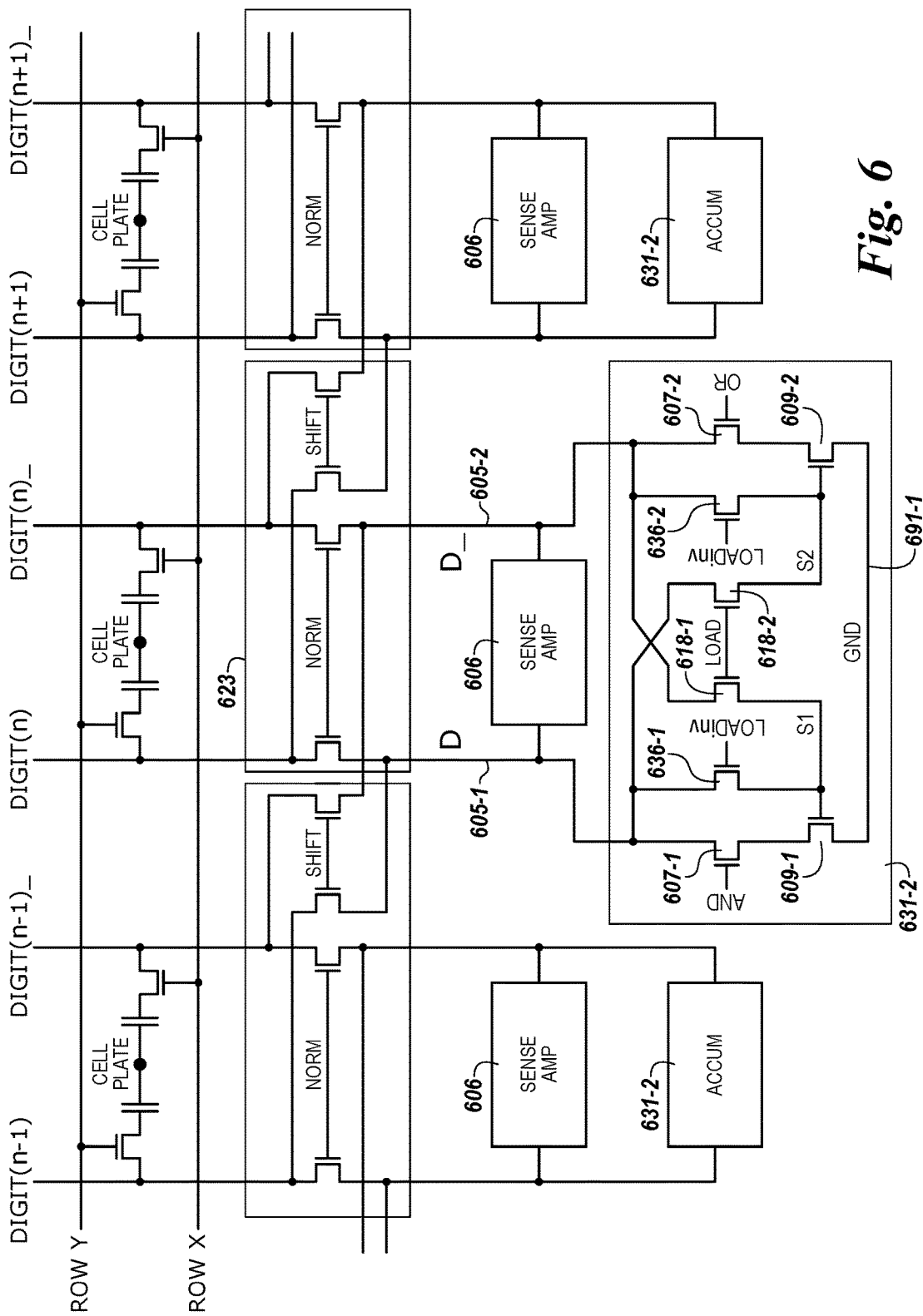
FIG. 6 is a schematic diagram illustrating sensing circuitry in accordance with a number of embodiments of the present disclosure.

FIG. 6 is a schematic diagram illustrating sensing circuitry in accordance with a number of embodiments of the present disclosure. The circuit illustrated in FIG. 6 is similar to the circuit illustrated in FIG. 2 but with an alternative compute component 631-2 configuration having a modified invert implementation, as shown in FIG. 6 (and described below). The circuit illustrated in FIG. 6 can have a sense amplifier 606 coupled between data lines D 605-1 and D_ 605-2, and can have shift circuitry 623 coupled intermediate within and between different pairs of data lines D 605-1 and D_ 605-2, for example.

In the example illustrated in FIG. 6, the circuitry corresponding to compute component 631-2 implements a latch (e.g., a secondary latch) that includes eight transistors. The compute component 631-2 can operate as/be, for example, an accumulator. The compute component 631-2 can be coupled to each of the data lines D 605-1 and D_ 605-2 as shown in FIG. 6. However, embodiments are not limited to this example. The transistors of compute component 631-2 can all be n-channel transistors (e.g., NMOS transistors), for example.

The voltages or currents on the respective data lines D 605-1 and D_ 605-2 can be communicated to the respective inputs of the compute component 631-2 (e.g., inputs of the secondary latch). In this example, data line D 605-1 can be coupled to a first source/drain region of a first pass transistor 607-1 as well as to a first source/drain region of load transistor 618-2 and invert transistor 636-1. Data line D_ 605-2 can be coupled to a first source/drain region of pass transistor 607-2 as well as to a first source/drain region of load transistor 618-1 and invert transistor 636-2.

The gates of load transistor 618-1 and 618-2 can be commonly coupled to a LOAD control signal. A second source/drain region of load transistor 618-1 can be directly coupled to a gate of transistor 609-1, the gate of transistor 609-1 being referred to as node S1. A second source/drain region of load transistor 618-2 can be directly coupled to a gate of transistor 609-2, the gate of transistor 609-2 being referred to as node S2.

A second source/drain region of inverting transistor 636-1 can be directly coupled to a gate of transistor 609-1 and a second source/drain region of load transistor 618-1. A second source/drain region of inverting transistor 636-2 can be directly coupled to a gate of transistor 609-2 and a second source/drain region of load transistor 618-2. A second source/drain region of transistors 609-1 and 609-2 can be commonly coupled to a negative reference signal control line 691-1 providing a reference signal (e.g., ground (GND)). A gate of pass transistor 607-1 can be coupled to a control signal AND. A gate of pass transistor 607-2 can be coupled to a control signal OR. A gate of invert transistor 636-1 can be coupled to a control signal LOADinv. A gate of invert transistor 636-2 can also be coupled to the control signal LOADinv.

The circuit shown in FIG. 6 stores accumulator data dynamically on nodes S1 and S2. Activating the LOAD control signal causes load transistors 618-1 and 618-2 to conduct, and thereby load complementary data onto nodes S1 and S2. Note however that the data value corresponding to data line D_ 605-2 is loaded onto node S1 and the data value corresponding to data line D 605-1 is loaded onto node S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 6 is not contingent on the LOAD control signal being elevated to a voltage greater than $V_{DD}$.

The circuit illustrated in FIG. 6 is a modification of the circuit illustrated in FIG. 2 with respect to the configuration of the accumulator transistors. According to various embodiments of the present disclosure, the circuit of FIG. 6 can be operated to load a true or compliment data value into the accumulator, rather than loading a true data value into the accumulator and subsequently selecting to use the true or compliment data value while performing operations to implement logical operations, as described with respect to the circuit illustrated in FIG. 2. The NOT (e.g., invert) function can be accomplished using the circuit illustrated in FIG. 6 by first loading the inverse data value into the accumulator directly, which can be subsequently used without further operations to invert it.

Figure 7:
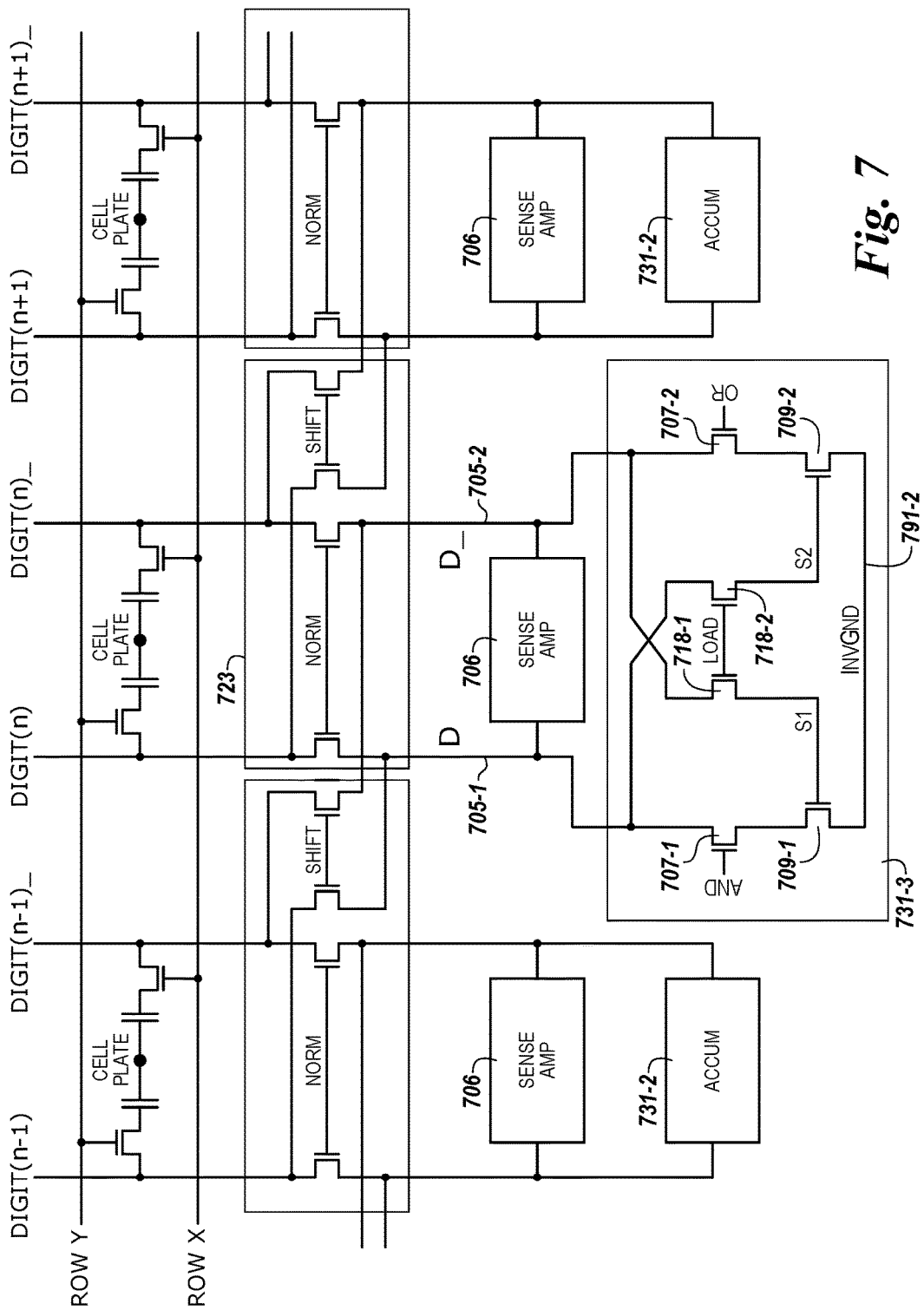
FIG. 7 is a schematic diagram illustrating sensing circuitry in accordance with a number of embodiments of the present disclosure.

FIG. 7 is a schematic diagram illustrating sensing circuitry in accordance with a number of embodiments of the present disclosure. The circuit illustrated in FIG. 7 is similar to the circuit illustrated in FIG. 6 but with an alternative compute component 731-3 configuration having a modified invert implementation, as explicitly shown in FIG. 7 (and described below).

As shown in FIG. 7, within compute component 731-3 load transistors 718-1 and 718-2 can correspond to load transistors 618-1 and 618-2 shown in FIG. 6, transistor 707-1 (with gate coupled to the AND control signal) can correspond to transistor 607-1 shown in FIG. 6, transistor 707-2 (with gate coupled to the OR control signal) can correspond to transistor 607-1 shown in FIG. 6, transistor 709-1 (with gate being node S1) can correspond to transistor 609-1 shown in FIG. 6, and transistor 709-2 (with gate being node S2) can correspond to transistor 609-1 shown in FIG. 6.

The compute component 731-3 shown in FIG. 7 is different from the compute component 631-3 shown in FIG. 6 by not including invert transistors (e.g., 636-1 and 636-2 shown in FIG. 6). Therefore, the connections of other circuit elements to the invert transistors as described with respect to FIG. 6 do not exist with respect to the compute component 731-3 shown in FIG. 7. Eliminating the two invert transistors from the circuit shown in FIG. 7 compared to the circuit shown in FIG. 6 (e.g., eliminating invert transistors 636-1 and 636-2 shown in FIG. 6) can result in an approximately four percent (4%) smaller die size.

In addition, the second source/drain region of transistors 709-1 and 709-2 are commonly coupled to a different reference signal indicated on FIG. 7 as "INVGND," which represents an elevated reference voltage (e.g., approximately 3.0 V) having a potential elevated to a voltage greater than a ground reference voltage (e.g., GND shown in FIG. 6). While a specific example voltage is provided above, embodiments of the present disclosure are not limited to the particular magnitude provided, and the elevated reference voltage can be higher, or lower, than 3.0 V, as long as the magnitude of the elevated reference voltage is greater than ground (e.g., about 0.0 V). According to some embodiments, the elevated reference voltage can be configured with the capability to switch between a low reference voltage (e.g., ground) and an elevated reference voltage.

To accomplish a NOT logic function (e.g., invert) using the different configuration of compute component 731-3 (with respect to the configuration of compute component 631-2) and the elevated reference voltage, the sense amplifier 706 coupled between data lines 705-1 (D) and 705-2 (D_) is precharged (e.g., "readied") for a sense operation. The INVGND signal 791-2 is then switched from a low reference voltage (e.g., ground) to an elevated reference voltage, which produces a voltage separation on the complementary data lines that can be loaded into and distinguished by the sense amp.

Figure 8:
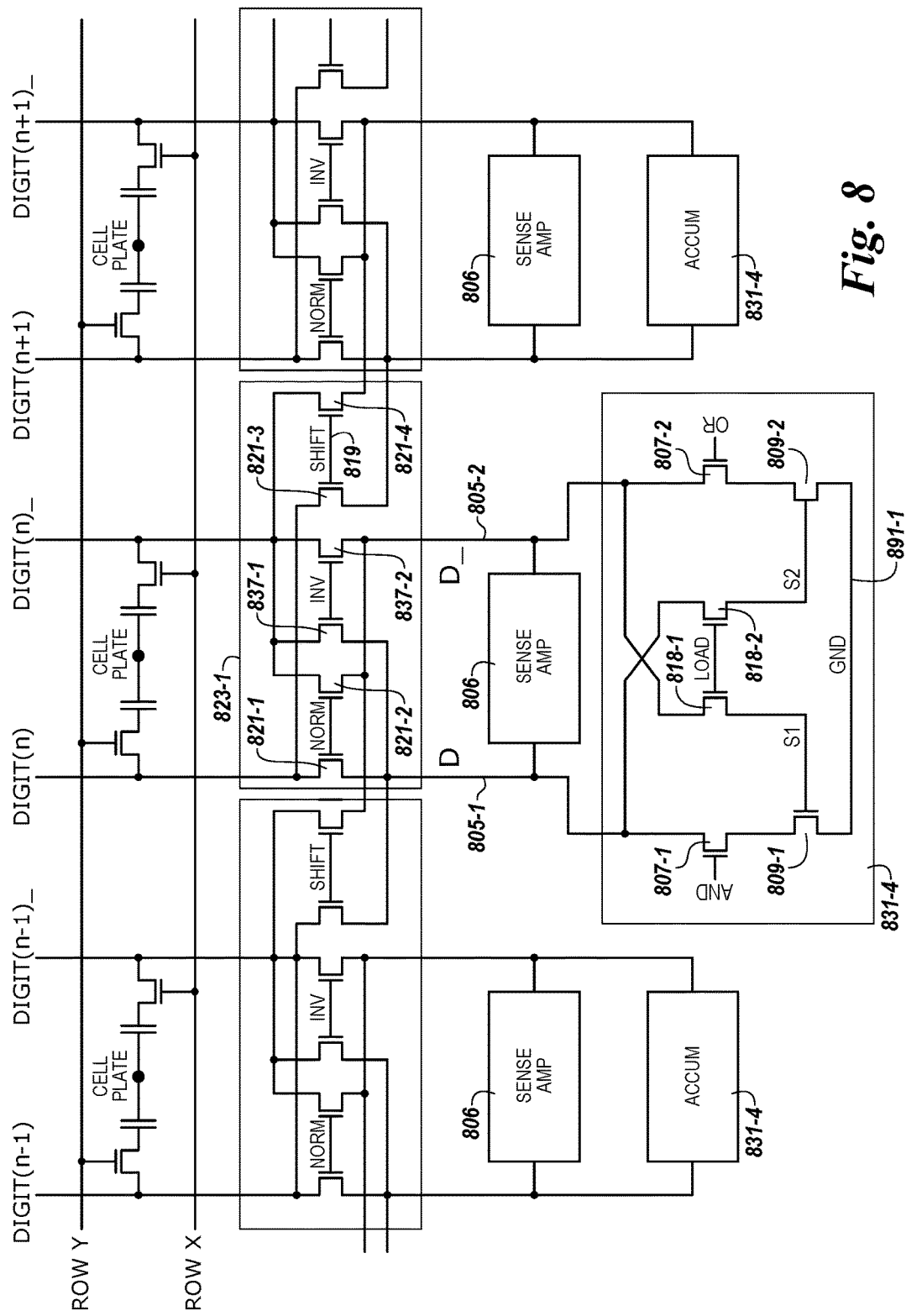
FIG. 8 is a schematic diagram illustrating sensing circuitry in accordance with a number of embodiments of the present disclosure.

FIG. 8 is a schematic diagram illustrating sensing circuitry in accordance with a number of embodiments of the present disclosure. The circuit illustrated in FIG. 8 is similar to the circuit illustrated in FIG. 7 but with an alternative compute component 831-4 configuration having a modified invert implementation, as explicitly shown in FIG. 8 (and described below).

As shown in FIG. 8, within compute component 831-4 load transistors 818-1 and 818-2 can correspond to load transistors 718-1 and 718-2 shown in FIG. 7, transistor 807-1 (with gate coupled to the AND control signal) can correspond to transistor 707-1 shown in FIG. 7, transistor 807-2 (with gate coupled to the OR control signal) can correspond to transistor 707-1 shown in FIG. 7, transistor 809-1 (with gate being node S1) can correspond to transistor 709-1 shown in FIG. 7, and transistor 809-2 (with gate being node S2) can correspond to transistor 709-1 shown in FIG. 7. Also like the compute component 731-3 shown in FIG. 7, the compute component 831-4 does not include invert transistors (e.g., 636-1 and 636-2 shown in FIG. 6).

Unlike the compute component 731-3 shown in FIG. 7, the negative reference signal control line 891-1 in the compute component 831-4 does not provide an elevated reference voltage and is not configured to switch from a low reference voltage to an elevated reference voltage. Rather, the negative reference signal control line 891-1 in the compute component 831-4 provides a reference signal (e.g., ground (GND)) as was described with respect to negative reference signal control line 691-1 shown in FIG. 6.

The shift circuitry 823-1 shown in the circuit illustrated in FIG. 8 is configured differently than the shift circuitry 723 shown in the circuit illustrated in FIG. 7 (shift circuitry configuration is described with respect to FIG. 2). The isolation transistors 821-1 and 821-2 having respective gates commonly coupled to the NORM control signal, and isolation transistors 821-3 and 821-4 having respective gates commonly coupled to the SHIFT control signal 819 are arranged in shift circuitry 823-1 in the same manner described for isolation transistors 221-1, 221-2, 221-3, and 221-4 shown in FIG. 2. The NORM and SHIFT control signals operate as described with respect to FIG. 2.

However, shift circuitry 823-1 shown in FIG. 8 includes an additional a pair of invert transistors (e.g., 837-1 and 837-2) in addition to the isolation transistors 221-1, 221-2, 221-3, and 221-4 shown in, and described with respect to, FIG. 2. A first source/drain region of invert transistor 837-1 is directly coupled to data line D_ 805-2 and a second source/drain region of invert transistor 837-1 is directly coupled to data line D 805-1. A first source/drain region of invert transistor 837-2 is directly coupled to data line D 805-1 and a second source/drain region of invert transistor 837-2 is directly coupled to data line D_ 805-2. Respective gates of invert transistors 837-1 and 837-2 are commonly coupled to an invert (INV) control signal.

The NOT logical operation (invert) can be accomplished by multiplexing ("muxing") data lines through the shift circuitry 823-1 (e.g., at the isolation gate level). The invert transistors 837-1 and 837-2 are arranged to communicate the data value corresponding to the voltage from one of the complementary data lines on a memory array side of the shift circuitry 823-1 to the other one of the complementary data lines on a sensing circuitry side of the shift circuitry 823-1 when the INV control signal is activated. That is, when the INV control signal is activated and the invert transistors 837-1 and 837-2 are conducting, data line D_ 805-2 is coupled to data line D 805-1 through invert transistor 837-1, and data line D 805-1 is coupled to data line D_ 805-2 through invert transistor 837-2. In this manner, an inverted data value can be loaded into the sense amplifier 806 and/or the accumulator 831-4.

The isolation transistors 821-1, 821-2, 821-3, and 821-4, together with the invert transistors 837-1 and 837-2, can be operated as a 3-to-1 multiplexor in the shift circuitry 823-1 to accomplish the SHIFT and invert functions. That is, one of 3 data lines (e.g., adjacent right data lines, adjacent left data lines, or opposite data lines of a complementary pair) can be coupled to the output of the shift circuitry 823-1 that is coupled to data line D 805-1 and D_ 805-2.

Figure 9:
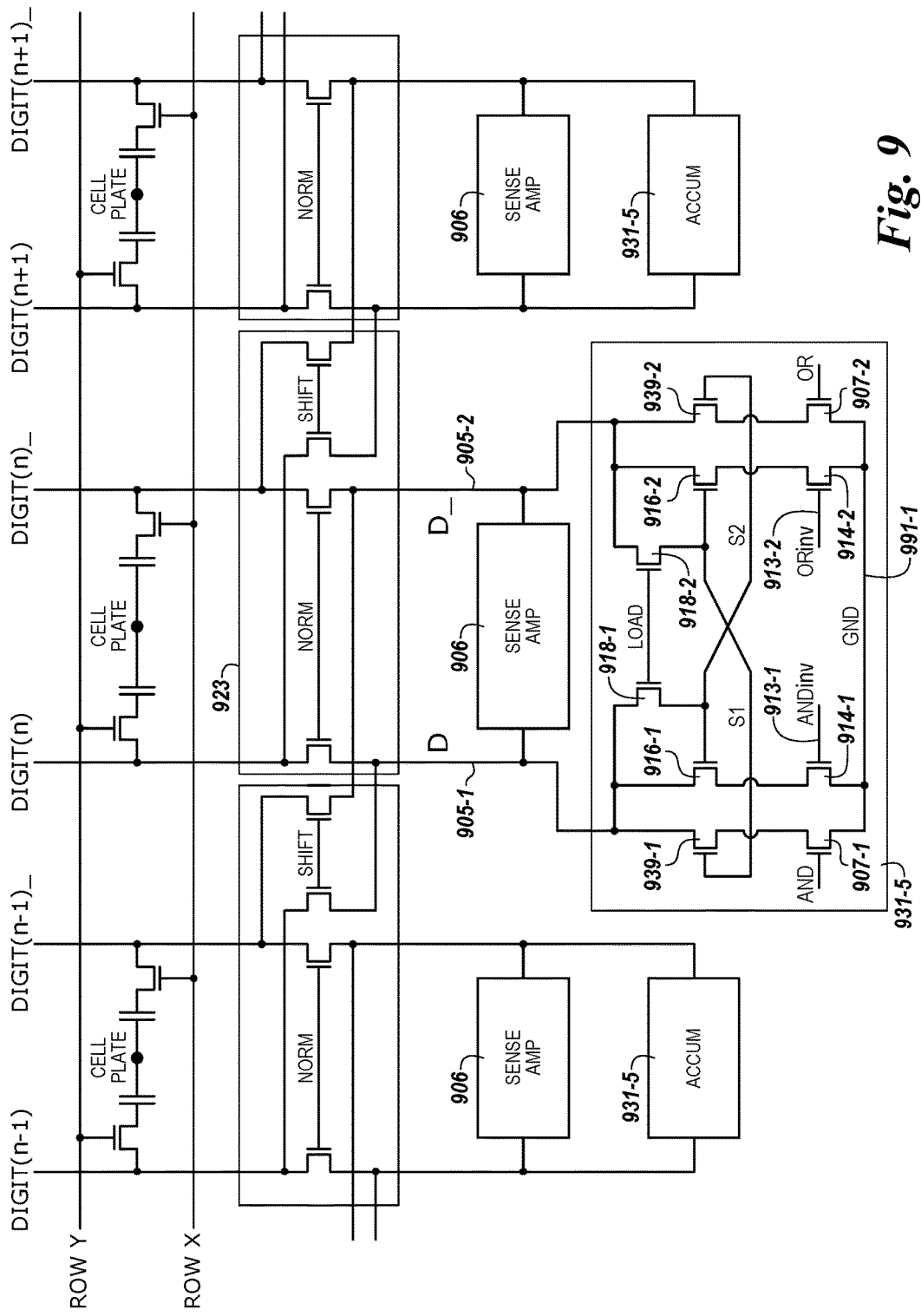
FIG. 9 is a schematic diagram illustrating sensing circuitry in accordance with a number of embodiments of the present disclosure.

FIG. 9 is a schematic diagram illustrating sensing circuitry in accordance with a number of embodiments of the present disclosure. The circuit illustrated in FIG. 9 is similar to the circuit illustrated in FIG. 2 but with an alternative compute component 931-5 configuration having a modified invert implementation, as explicitly shown in FIG. 9 (and described below).

In the example illustrated in FIG. 9, the circuitry corresponding to compute component 931-5 implements a dynamic latch, which can be referred to herein as a secondary latch. The secondary latch of the compute component 931-5 can serve as an accumulator. As such, the compute component 931-5 can be referred to herein as an accumulator. The compute component 931-5 can be coupled to each of the data lines D 905-1 and D_ 905-2 as shown in FIG. 9. However, embodiments are not limited to this example. The transistors of compute component 931-5 can all be n-channel transistors (e.g., NMOS transistors), for example.

In this example, data line D 905-1 can be coupled to a first source/drain region of transistors 916-1 and 939-1, as well as to a first source/drain region of load transistor 918-1. Data line D_ 905-2 can be coupled to a first source/drain region of transistors 916-2 and 939-2, as well as to a first source/drain region of load transistor 918-2.

The gates of load transistor 918-1 and 918-2 can be commonly coupled to a LOAD control signal. A second source/drain region of load transistor 918-1 can be directly coupled to the gates of transistors 916-1 and 939-2. A second source/drain region of load transistor 918-2 can be directly coupled to the gates of transistors 916-2 and 939-1.

A second source/drain region of transistor 916-1 can be directly coupled to a first source/drain region of pull-down transistor 914-1. A second source/drain region of transistor 939-1 can be directly coupled to a first source/drain region of pull-down transistor 907-1. A second source/drain region of transistor 916-2 can be directly coupled to a first source/drain region of pull-down transistor 914-2. A second source/drain region of transistor 939-2 can be directly coupled to a first source/drain region of pull-down transistor 907-2. A second source/drain region of each of pull-down transistors 907-1, 907-2, 914-1, and 914-2 can be commonly directly coupled to a reference voltage 991-1 (e.g., ground (GND)). A gate of pull-down transistor 907-1 can be coupled to an AND control signal line, a gate of pull-down transistor 914-1 can be coupled to an ANDinv control signal line 913-1, a gate of pull-down transistor 914-2 can be coupled to an ORinv control signal line 913-2, and a gate of pull-down transistor 907-2 can be coupled to an OR control signal line.

The gate of transistor 939-1 can be referred to as node S1, and the gate of transistor 939-2 can be referred to as node S2. The circuit shown in FIG. 9 stores accumulator data dynamically on nodes S1 and S2. Activating the LOAD control signal causes load transistors 918-1 and 918-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 9 is not contingent on the LOAD control signal being elevated to a voltage greater than $V_{DD}$.

The configuration of compute component 931-5 shown in FIG. 9 includes two (2) additional transistors than the configuration of compute component 231-1 shown in FIG. 2. However, the configuration of compute component 931-5 shown in FIG. 9 has the benefit of balancing the sense amplifier for functionality when the pull-down transistors 907-1, 907-2, 914-1, and 914-2 are conducting before the sense amplifier 906 is fired (e.g., during pre-seeding of the sense amplifier 906). As used herein, firing the sense amplifier 906 refers to enabling the sense amplifier 906 to set the primary latch and subsequently disabling the sense amplifier 906 to retain the set primary latch. Performing logical operations after equilibration is deactivated (in the sense amp), but before the sense amplifier fires, can save power usage because the latch of the sense amplifier does not have to be "flipped" using full rail voltages (e.g., $V_{DD}$, GND).

Inverting transistors that pull-down a respective data line in performing certain logical operations, including transistor 916-1 (having a gate coupled to S2 of the dynamic latch) in series with transistor 914-1 (having a gate coupled to an ANDinv control signal line 913-1), and transistor 916-2 (having a gate coupled to S1 of the dynamic latch) in series with transistor 914-2 (having a gate coupled to an ORinv control signal line 913-2) can operate to pull one of the data lines 905-1 or 905-2 to a ground reference potential so as to invert a first operand of a logical operation.

By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 914-1 to conduct and activating the ANDinv control signal causes transistor 914-2 to conduct.

In each case, asserting the appropriate inverted control signal can flip the sense amplifier and cause the result initially stored in the sense amplifier 906 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

Figure 10:
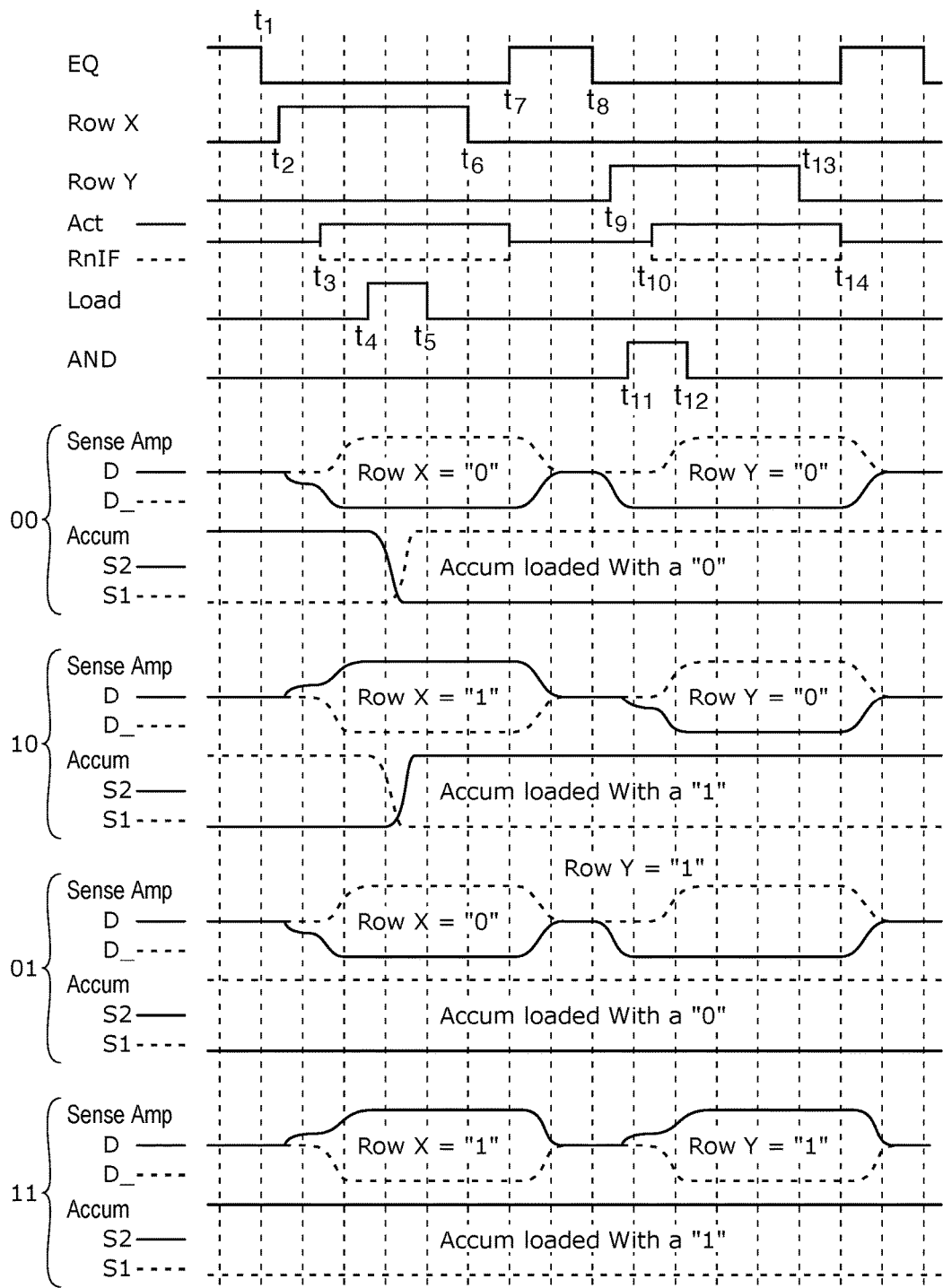
FIG. 10 illustrates a timing diagram associated with performing a number of logical operations using sensing circuitry in accordance with a number of embodiments of the present disclosure.

FIG. 10 illustrates a timing diagram associated with performing a number of logical operations using sensing circuitry in accordance with a number of embodiments of the present disclosure. FIG. 10 illustrates a timing diagram associated with initiating an AND logical operation before starting to load the second operand (e.g., Row Y data value) into the sense amplifier. FIG. 10 illustrates the sense amplifier and accumulator signals for various combinations of first and second operand data values. FIG. 10 shows the respective sense amplifier and accumulator signals corresponding to each combination of Row X data value and Row Y data value in each set. The particular timing diagram signals are discussed below with respect to the pseudo code associated with an AND operation of the circuit shown in FIG. 9.

Operations to load data (e.g., Row X) into the accumulator 931-5 are the same as described with respect to the accumulator 231-1 for the circuit shown and described with respect to FIG. 2 and the timing diagram illustrated in FIG. 3 (e.g., operations at times $t_1$ through $t_7$). Once the data value (e.g., Row X) is stored in the sense amplifier 906 and copied to the dynamic latch of the accumulator, example operations to AND Row X with Row Y can be summarized as follows:

Deactivate EQ
Open Row Y
Activate AND
This results in the sense amplifier being written with AND result data:
  If the accumulator contains a "0" (i.e., a voltage corresponding to a "0" on node S2 and a voltage corresponding to a "1" on node S1), then the sense amplifier data are forced to a "0"
  If the accumulator contains a "1" (i.e., a voltage corresponding to a "1" on node S2 and a voltage corresponding to a "0" on node S1), then the sense amplifier data remains unchanged and will sense what is contained in Row Y
This operation leaves the data in the accumulator unchanged.
Fire Sense Amps
Result of AND function resides in the sense amp
Result of the AND function is also written to Row Y (Row Y is open). Alternatively, Row Y can be first copied to the resultant Row before this function is performed.
Close Row Y
Deactivate AND
Precharge In the pseudo code above, "Deactivate EQ" shown at $T_8$ in FIG. 10 and "Open Row Y" shown at $t_9$ in FIG. 10 are the same as described above with respect to FIG. 2 and the timing diagram illustrated in FIG. 3 implementing an AND operation. The sense amps 906 are fired at $t_{10}$ after Row Y is opened as shown in FIG. 10. However, different from the timing of operations shown in FIG. 3, and as shown in FIG. 10, the "Activate AND" in the pseudo code above occurs before firing the sense amps with respect to the sensing circuitry illustrated in FIG. 9. That is, $t_{11}$ occurs before $t_{10}$, as illustrated in FIG. 10.

The "Activate AND" in the pseudo code above indicates that the AND control signal goes high as shown at $t_{11}$ in FIG. 10, causing pull-down transistor 907-1 to conduct. Depending on the data value (e.g., from Row X) loaded into the accumulator 931-5, the sensing circuitry illustrated in FIG. 9 is configured to either sense the Row Y data value normally (e.g., when the data value (e.g., from Row X) loaded into the accumulator 931-5 is a "1") or force the sense amplifier 906 to store a "0" (e.g., when the data value (e.g., from Row X) loaded into the accumulator 931-5 is a "0"), as described further below. According to various embodiments, the "Activate AND" in the pseudo code can also occur prior to, or simultaneous with, opening Row Y and result in the correct result being stored in the sense amps when subsequently fired.

Although the pseudo code above indicates that "Deactivate AND" occurs after the sense amps are fired, "Deactivate AND" can occur in proximity to (e.g., just before, at the same time, or just after) the sense amps firing since the "Activate AND" operation has already begun to appropriately modify the voltages present on the data lines D and D_ from the equilibrate voltage (e.g., $V_{DD}/2$), which firing the sense amplifier drives the voltage on the data lines D and D_ to the respective rails. In this manner, activating the AND control signal causes the value of the function (e.g., Row X AND Row Y) to be reflected on the data lines D and D_ and written to the sense amplifier 906 when it fires thereafter.

With the first data value (e.g., Row X) stored in the dynamic latch of the accumulator 931-5 and in the sense amplifier 906, and the second data value (e.g., Row Y) impacting the voltages present on the data lines 905-1 (D) and 905-2 (D_), if the dynamic latch of the accumulator 931-5 contains a "0" (i.e., a voltage corresponding to a "0" on node S2 (which is coupled to data line D through load transistor 918-1) and a voltage corresponding to a "1" on node S1), the sense amplifier data is written to a "0" (regardless of the Row Y data value initially indicated the on the data lines 905-1 (D) and 905-2 (D_)). The voltage corresponding to a "1" on node S1 is applied to the gate of transistor 939-1, which causes transistor 939-1 to conduct thereby coupling the sense amplifier 1306 to ground through transistor 939-1, pull-down transistor 907-1 (conducting due to the AND control signal being high), and data line D 905-1. When either data value of an AND operation is "0," the result is a "0." When the first data value (e.g., from Row X stored in the dynamic latch) is a "0," the result of the AND operation is a "0" regardless of the state of the second data value (e.g., from Row Y), and so the configuration of the sensing circuitry causes the "0" result to be written and initially stored in the sense amplifier 906. This operation leaves the data value in the accumulator unchanged (e.g., from Row X).

If the dynamic latch of the accumulator contains a "1" (e.g., from Row X), then the result of the AND operation depends on the data value stored in Row Y. The result of the AND operation should be a "1" if the data value stored in Row Y is a "1," but the result of the AND operation should be a "0" if the data value stored in Row Y is a "0." The sensing circuitry 931-5 is configured such that if the dynamic latch of the accumulator contains a "1" (i.e., a voltage corresponding to a "1" on node S2 and a voltage corresponding to a "0" on node S1), the Row Y data value on the data lines 905-1 (D) and 905-2 (D_) is sensed normally. Transistor 939-1 does not conduct, and although transistor 907-1 is conducting due to the AND control signal applied to the gate of transistor 907-1, the sense amplifier 906 is not coupled to ground through data line 905-1, and the data value previously stored in the sense amplifier 906 remains unchanged (e.g., Row X data value so the AND operation result is a "1" if the Row Y data value is a "1" and the AND operation result is a "0" if the Row Y data value is a "0"). The sense amplifier 906 is also not coupled to ground via data line 905-2 since transistor 907-2 is not conducting (even though transistor 939-2 is conducting due to a "1" on node S2). This AND operation leaves the data value in the accumulator unchanged (e.g., from Row X).

After the "Activate AND" signal causes pull-down transistor 907-1 to conduct and change the voltage on data line 905-1 from the equilibrate voltage, "Fire Sense Amps" in the pseudo code above indicates that the sense amplifier 906 is enabled to amplify the differential signal between D 905-1 and D_ 905-2, resulting in a voltage (e.g., $V_{DD}$) corresponding to a logic 1 or a voltage (e.g., GND) corresponding to a logic 0 being on data line D 905-1 (and the voltage corresponding to the other logic state being on complementary data line D_ 905-2). The dynamic latch still corresponds to the data value from memory cell coupled to Row X since the dynamic latch is unchanged. However, since Row Y is open the result of the AND function is also written to Row Y. Alternatively, Row Y can be first copied to a resultant Row (and the Resultant Row left open) before this function is performed.

FIG. 10 shows, in the alternative, the behavior of voltage signals on the data lines (e.g., 905-1 (D) and 905-2 (D_) shown in FIG. 9) coupled to the sense amplifier (e.g., 906 shown in FIG. 9) and the behavior of voltage signals on nodes S1 and S2 of the dynamic latch of the compute component (e.g., 931-5 shown in FIG. 9) for an AND logical operation involving each of the possible combination of operands (e.g., Row X/Row Y data values 00, 10, 01, and 11).

Although the pseudo code above indicates that Close Row Y" occurs before "Deactivate AND," the timing diagram illustrated in FIG. 10 shows that the AND control signal goes low while Row Y remains open. Various embodiments of the present disclosure can include the "Deactivate AND" occurring before, or after, Row Y closes. The result of the AND operation is fixed by operation of the primary latch once the sense amplifier fires.

After the sense amps fire and the result is also stored in Row Y (or another resultant Row) of the memory array, in the pseudo code above, "Close Row Y" indicates that the selected row (e.g., Row Y) is disabled, which can be accomplished by the access transistor turning off to decouple the selected cell from the data line D 905-1. Once the selected Row Y is closed and the memory cell is isolated.

Before (shown in timing diagram of FIG. 10) or after (indicated in pseudo code) Row Y is closed, "Deactivate AND" in the pseudo code above indicates that the AND control signal goes low, causing pull-down transistor 907-1 to stop conducting and isolate the sense amplifier 906 (and data line D 905-1) from ground (regardless of the data value stored in the dynamic latch, which may cause transistor 939-1 to be conducting). With the data lines isolated, "Precharge" in the pseudo code above can cause a precharge of the data lines by an equilibrate operation, as described previously.

Figure 11:
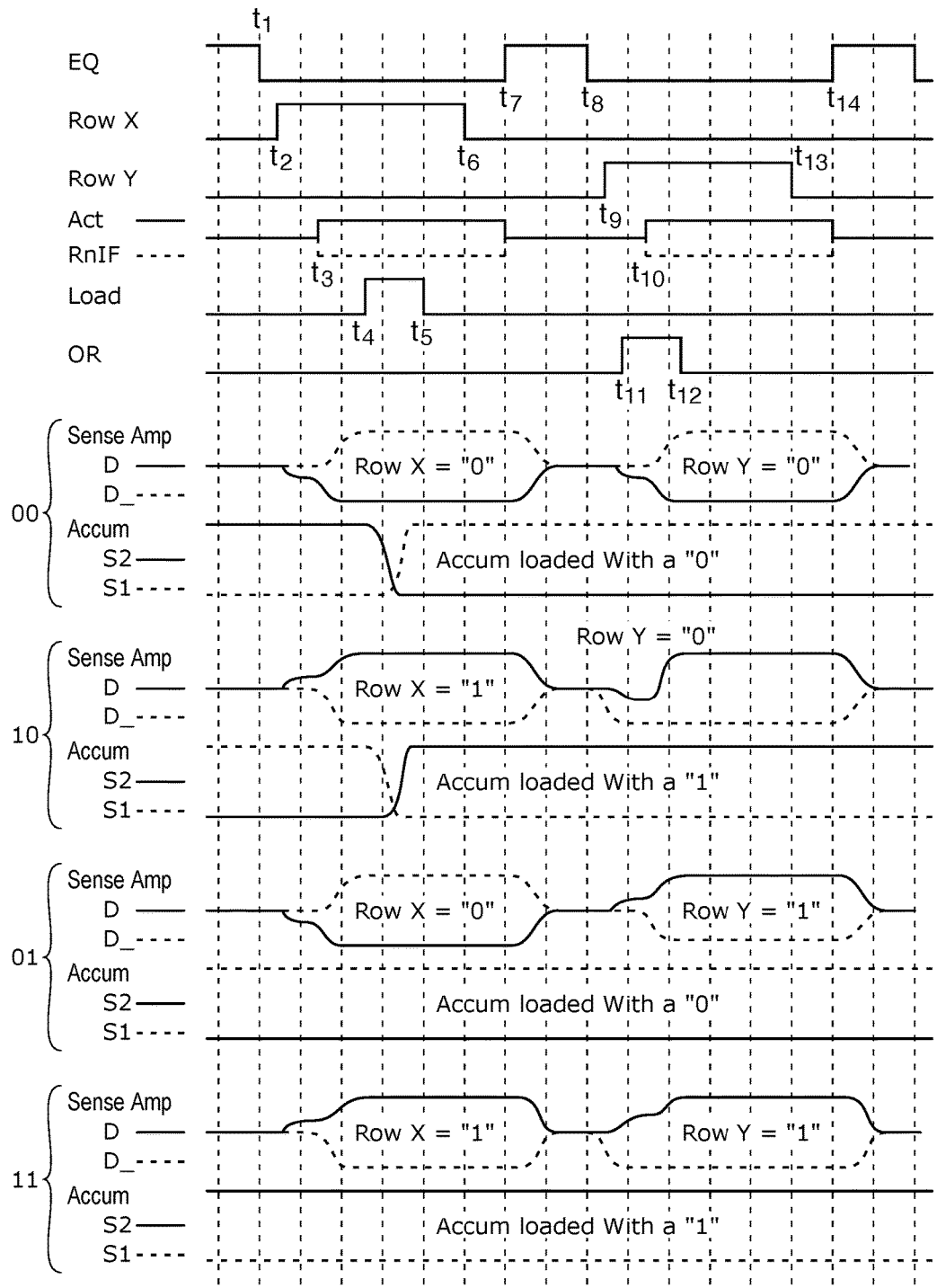
FIG. 11 illustrates a timing diagram associated with performing a number of logical operations using sensing circuitry in accordance with a number of embodiments of the present disclosure.

FIG. 11 illustrates a timing diagram associated with performing a number of logical operations using sensing circuitry in accordance with a number of embodiments of the present disclosure. A subsequent operation phase can alternately be associated with performing the OR operation on the first data value (e.g., Row X data value stored in the sense amplifier 906 and the dynamic latch of the accumulator 931-5) and the second data value (e.g., Row Y data value stored in a memory cell)). FIG. 11 illustrates a timing diagram associated with initiating an OR logical operation before starting to load the second operand (e.g., Row Y data value) into the sense amplifier. FIG. 11 illustrates the sense amplifier and accumulator signals for various combinations of first and second operand data values. The particular timing diagram signals are discussed below with respect to the pseudo code associated with an AND logical operation of the circuit shown in FIG. 9.

Operations to load data (e.g., Row X) into the accumulator 931-5 are the same as described above with respect to performing an AND logical operation. Once the data value (e.g., Row X) is stored in the sense amplifier 906 and copied to the dynamic latch of the accumulator, example operations to OR Row X with Row Y can be summarized as follows:

Deactivate EQ
Open Row Y
This modifies the voltage on the data lines from the equilibrate voltage based on the Row Y data value.
Activate OR
This results in the sense amplifier being written to the value of the function (e.g., Row X OR Row Y). This operation leaves the data in the accumulator unchanged.
Fire Sense Amps
Drives the voltages on the data lines to the rails
Result of OR function resides in the sense amp
Result of the OR function is also written to Row Y (Row Y is open—alternatively, Row Y can be first copied to the resultant Row before this function is performed)
Deactivate OR
Close Row Y
Precharge In the pseudo code above, "Deactivate EQ" shown at $T_8$ in FIG. 11 and is the same as described above with respect the AND logical operation involving FIG. 9 and the timing diagram illustrated in FIG. 10. The "Activate OR" in the pseudo code above occurs before firing the sense amps with respect to the sensing circuitry illustrated in FIG. 9. That is, $t_{11}$ occurs before $t_{10}$, as illustrated in FIG. 11.

After equilibration is deactivated and with the Row X data value stored in the sense amplifier 906 and the dynamic latch of the accumulator 931-5, a selected row for the second operand of the OR logical operation (e.g., ROW Y) is enabled as indicated in the pseudo code above by "Open Row Y" and shown in FIG. 11 at $t_9$. When the voltage signal applied to ROW Y reaches the threshold voltage (Vt) of the access transistor corresponding to the selected cell coupled to Row Y, the access transistor turns on and couples the data line (e.g., D_ 905-1) to the selected cell which can attempt to create a differential voltage signal between the data lines.

The "Activate OR" in the pseudo code above indicates that the OR control signal goes high as shown at $t_{11}$ in FIG. 11, causing pull-down transistor 907-2 to conduct. This operation leaves the data in sense amplifier and the accumulator unchanged. If the accumulator contains a "0" (Row X data) (i.e., a voltage corresponding to a "0" on node S2 and a voltage corresponding to a "1" on node S1), the pull-down transistor is conducting (by the OR control signal being high) but the complementary data line (D_) is not pulled-down because transistor 939-2 is off and the sense amplifier data remains unchanged (Row X data) until Row Y is opened. If the accumulator contains a "1" (Row X data) (i.e., a voltage corresponding to a "1" on node S2 and a voltage corresponding to a "0" on node S1), the complementary data line (D_) is pulled-down because the pull-down transistor is conducting (by the OR control signal being high) and transistor 939-2 is conducting (by the S2 voltage being high) so the sense amplifier data remains unchanged (Row X data) for the time being.

Although the pseudo code above shows that "Activate OR" occurs after Row Y is opened, according to various embodiments "Activate OR" can occur simultaneous to or before opening Row Y. The sensing circuitry shown in FIG. 9 is configured to force the sense amplifier to a "1" if the accumulator contains a "1" (Row X data) when the "Activate OR" occurs and configured to sense the Row Y data value normally if the accumulator contains a "0" (Row X data) when the "Activate OR" occurs whether the Row Y memory cell is coupled to the data lines before, simultaneously to, or after the "Activate OR" occurs. In contrast to the operations illustrated in FIG. 4, FIG. 11 shows the "Activate OR" occurring prior to firing the sense amps.

If the accumulator contains a "1" (i.e., a voltage corresponding to a "1" on node S2 and a voltage corresponding to a "0" on node S1), the complementary data line (D_) is pulled-down by the compute component 931-5 (as described above) and the sense amplifier data of a "1" remains unchanged regardless of the Row Y data (e.g., memory cell charge cannot overcome the pull-down). If the accumulator contains a "0" (i.e., a voltage corresponding to a "0" on node S2 and a voltage corresponding to a "1" on node S1), the complementary data line (D_) is not pulled-down by the compute component 931-5 (as described above), and if the Row Y data is also a "0" the sense amplifier data remains unchanged by the Row Y data. If the accumulator contains a "0" (i.e., a voltage corresponding to a "0" on node S2 and a voltage corresponding to a "1" on node S1), the complementary data line (D_) is not pulled-down by the compute component 931-5 (as described above), and if the Row Y data is also a "1" the sense amplifier data is written to a "1" based on the Row Y data. Opening Row Y leaves the data in the accumulator unchanged.

"Fire Sense Amps" in the pseudo code above indicates that the sense amplifier 906 is enabled to amplify the differential signal between D 905-1 and D 905-2, resulting in a voltage (e.g., $V_{DD}$) corresponding to a logic 1 or a voltage (e.g., GND) corresponding to a logic 0 being on data line D 905-1 (and the voltage corresponding to the other logic state being on complementary data line D_ 905-2). That is, firing the sense amps drives the voltages on the data lines to the rails. Firing the sense amps results in the sense amplifier being written to the value of the function (e.g., Row X OR Row Y), which may overwrite the data value from Row X previously stored in the sense amp. Since Row Y is open, the result of the OR function is also written to Row Y. Alternatively, Row Y can be first copied to a resultant Row (and the Resultant Row left open) before this function is performed. The dynamic latch still corresponds to the data value from memory cell coupled to Row X since the dynamic latch is unchanged.

The "Deactivate OR" in the pseudo code above indicates that the OR control signal goes low as shown at $t_{12}$ in FIG. 11, causing pull-down transistor 907-2 to not conduct and terminating pull-down of the complementary data line (D_) if previously pulled-down.

"Close Row Y" in the pseudo code above indicates that the memory cell coupled to Row Y is isolated from the data line (D), and with the data lines isolated, "Precharge" in the pseudo code above indicates a precharge of the data lines by an equilibrate operation, as described previously. As similarly discussed above with respect to the AND logical operation of the sense amplifier 906 and the compute component 931-5, Row Y can be opened before the logical operation control signal is activated (e.g., OR control signal goes high), Row Y can be closed before the OR control signal is deactivated, the OR control signal can be deactivated in proximity to the sense amplifier firing, and/or the OR control signal can be deactivated after the sense amplifier firing is complete. Also, "Activate OR" can occur after the sense amplifier firing, as described with respect to FIGS. 2 and 4.

Figure 12:
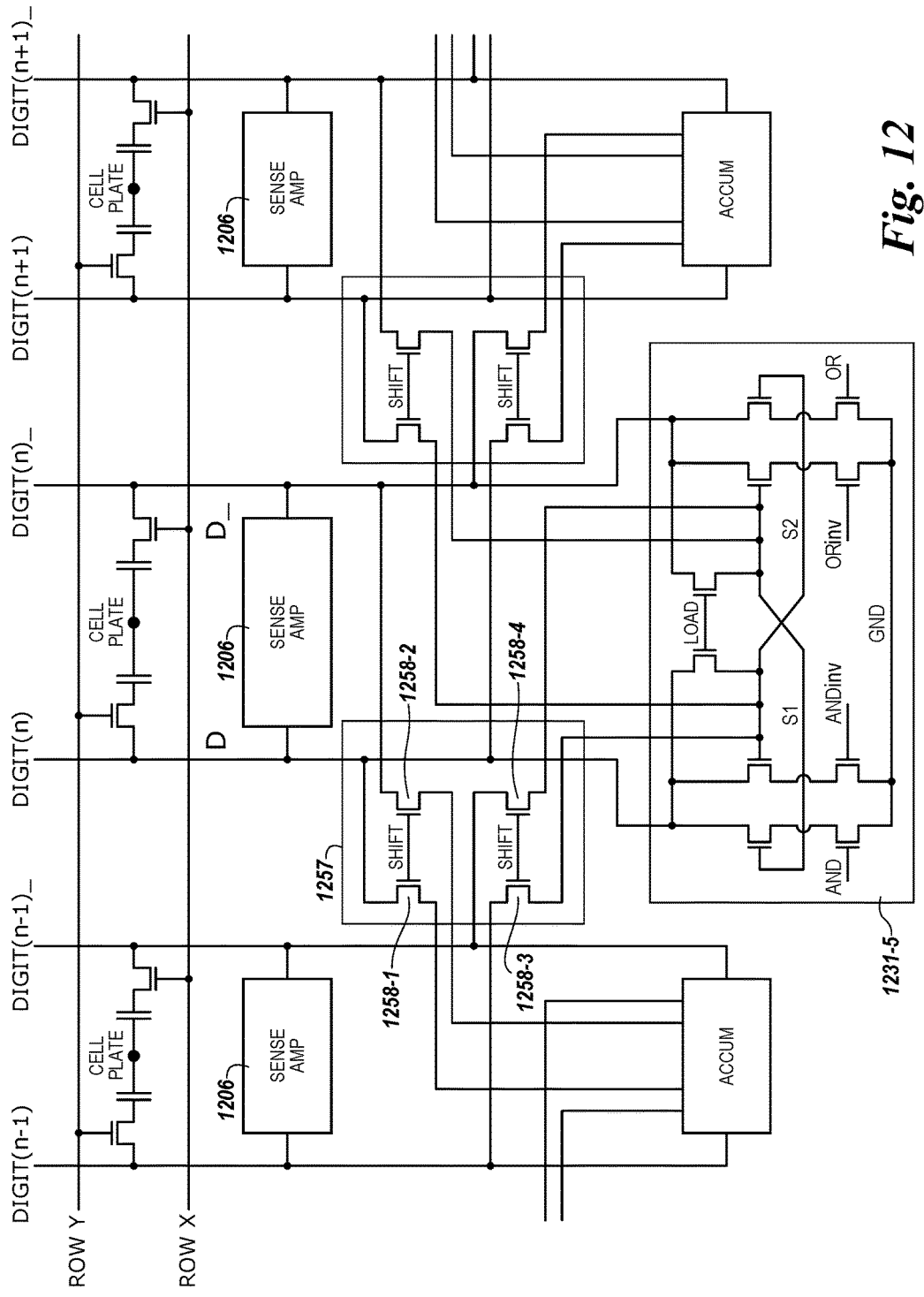
FIG. 12 is a schematic diagram illustrating sensing circuitry in accordance with a number of embodiments of the present disclosure.

FIG. 12 is a schematic diagram illustrating sensing circuitry in accordance with a number of embodiments of the present disclosure. The circuit illustrated in FIG. 12 is similar to the circuit illustrated in FIG. 9. Compute component 1231-5 can correspond to compute component 931-5. However, the configuration shown in FIG. 12 (and described below) includes a shift circuitry 1257 that is different in location and internal configuration from shift circuitry 923 shown in FIG. 9. The shift circuitry 1257 illustrated in FIG. 12 does not include isolation transistors in the complementary data lines to divide the complementary data lines into two portions.

Shift circuitry 1257 can be located and/or connections from the shift circuitry 1257 to the respective complementary data lines between the sense amplifier and the accumulator (whereas the shift circuitry 923 shown in FIG. 9 was located between the sense amplifier and the array of memory cells). The shift circuitry 1257 can be configured to selectively couple a plurality of data lines directly to the nodes of a dynamic latch of compute component 1231-5. According to various embodiments, compute component 1231-5 can otherwise be configured the same as compute component 931-5 illustrated and described with respect to FIG. 9.

According to various embodiments of the present disclosure, the shift circuitry 1257 can include transistor(s) coupled between adjacent data lines and a node (e.g., S1, S2) of a dynamic latch coupled through load transistors to in the compute component 1231-5 to data lines associated with the compute component 1231-5. For example, shift circuitry 1257 can include a transistors coupled between a data line of a pair of complementary data lines to one of the nodes of a dynamic latch of an adjacent accumulator such that when the transistor is made to conduct a data value on the data line is loaded onto the node of the dynamic latch of an adjacent accumulator, as shown in FIG. 12.

For example, FIG. 12 shows that shift circuitry 1257 can include four shift transistors. Shift transistor 1258-1 can be arranged between data line DIGIT(n) and node S2 of a dynamic latch of the accumulator to the left of the compute component 1231-5. Shift transistor 1258-2 can be arranged between data line DIGIT(n)_ and node S1 of a dynamic latch of the accumulator to the left of the compute component 1231-5. Shift transistor 1258-3 can be arranged between data line DIGIT(n−1)_ and node S1 of a dynamic latch of the compute component 1231-5. Shift transistor 1258-4 can be arranged between data line DIGIT(n−1) and node S2 of a dynamic latch of the compute component 1231-5. Gates of pairs of shift transistors of the shift circuitry 1257 that are respectively coupled to data lines of a pair of complementary data lines can be commonly coupled to a SHIFT control signal that is operated to control when a shift occurs by causing the shift transistors to conduct.

The change in configuration and location of the shift 1257 alters the SHIFT function by the circuit illustrated in FIG. 12 (compared to the SHIFT function implemented by the circuit illustrated in FIG. 9). The circuit illustrated in FIG. 12 can accomplish a SHIFT right by loading the dynamic latch of the accumulator with data values from the sense amplifier 1206 to the left, and can accomplish a SHIFT left by loading the dynamic latch of the accumulator with data values from the sense amplifier 1206 to the right. With the capabilities provided by shift circuitry 1257, the configuration illustrated in FIG. 12 effectively implements a 3-to-1 multiplexer for loading data values into the dynamic latch of the compute component 1231-5 (e.g., to S1 and S2). Data values can be loaded into the dynamic latch of the compute component 1231-5 from the sense amplifier 1206 to the left, from the sense amplifier 1206 to the right, of from the sense amplifier 1206 associated with (i.e., hardwired to) the particular compute component 1231-5.

According to various embodiments, the shift transistors of the shift circuitry 1257 can be transistors rated for a lower voltage than the isolation transistors of shift circuitry 923 shown in FIG. 9. For example, the isolation transistors (e.g., used for NORM and SHIFT operations) of shift circuitry 923 should be rated to switch between a reference voltage (e.g., ground) and an elevated voltage (e.g., 3 V, which is elevated with respect to the supply voltage of the memory array). The shift transistors of the shift circuitry 1257 can be rated to switch between a reference voltage (e.g., ground) and a supply voltage (e.g., $V_{DD}$), thus saving power by implementing the SHIFT function using the shift circuitry 1257 configuration provided in the circuit illustrated in FIG. 12. The configuration illustrated in FIG. 12 can also operate faster than the configuration illustrated in FIG. 9 because a Row cycle is not required to accomplish the SHIFT function.

Figure 13:
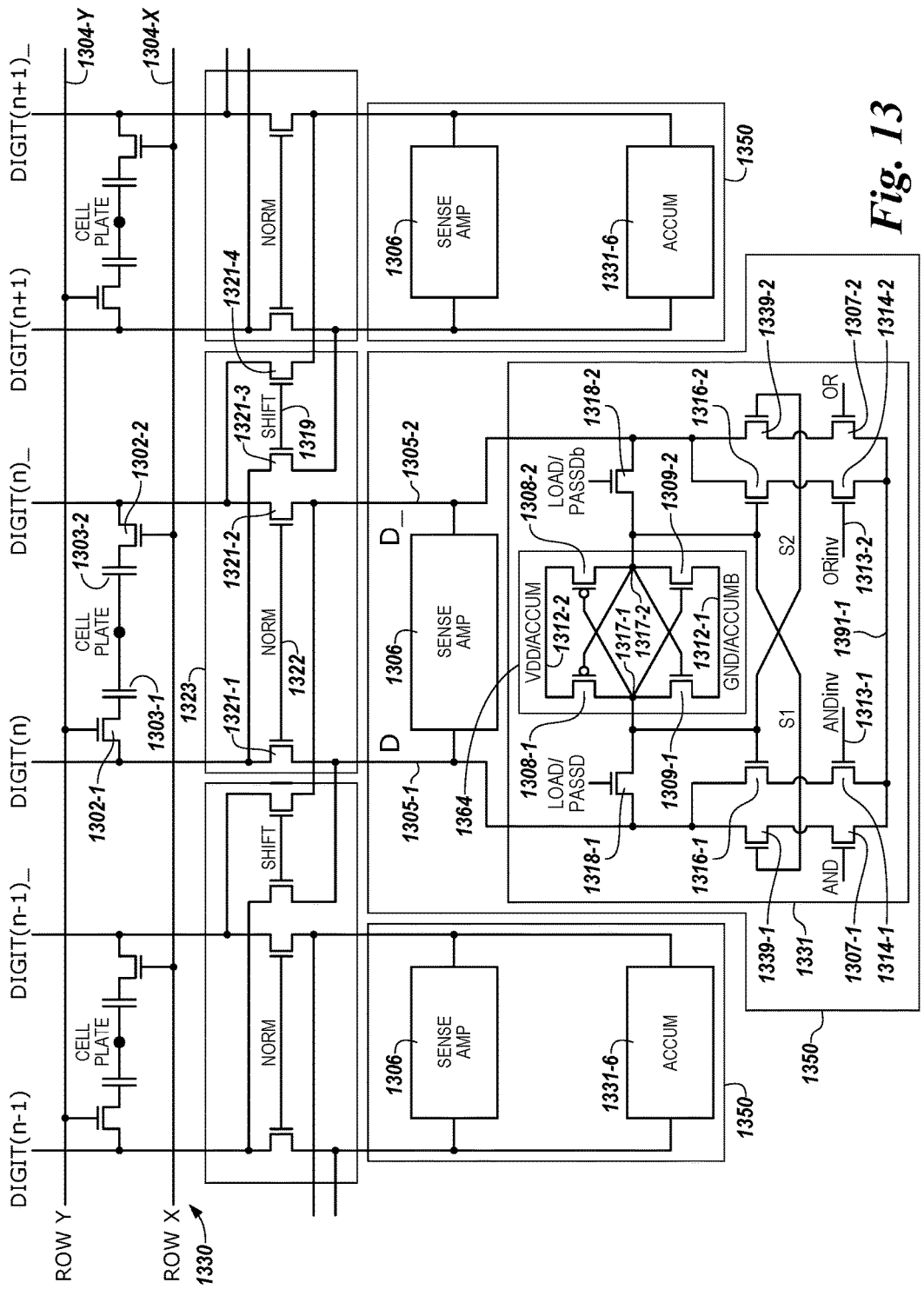
FIG. 13 is a schematic diagram illustrating sensing circuitry in accordance with a number of embodiments of the present disclosure.

FIG. 13 is a schematic diagram illustrating sensing circuitry 1350 in accordance with a number of embodiments of the present disclosure. A memory cell comprises a storage element (e.g., capacitor) and an access device (e.g., transistor). For instance, transistor 1302-1 and capacitor 1303-1 comprises a memory cell, and transistor 1302-2 and capacitor 1303-2 comprises a memory cell, etc. The cells of the memory array 1330 are arranged in rows coupled by word lines 1304-X (Row X), 1304-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. Shift circuitry 1323 is configured to include isolation transistors 1321-1 and 1321-2 coupled to a control signal 1322 (NORM) that, when activated, enables (e.g., turns on) the isolation transistors 1321-1 and 1321-2 to couple the corresponding sense amplifier 1306 and compute component 1331 to a corresponding column of memory cells (e.g., to a corresponding pair of complementary data lines 1305-1 (D) and 1305-2 (D_)). Shift circuitry 1323 is further configured to include isolation transistors 1321-3 and 1321-4 coupled to a complementary control signal 1319 (SHIFT) that, when activated (e.g., when NORM is deactivated), couples a particular sense amplifier 1306 and compute component 1331 to a different pair of complementary data lines (e.g., a pair of complementary data lines different than the pair of complementary data lines to which isolation transistors 1321-1 and 1321-2 couple the particular sense amplifier 1306 and compute component 1331).

The circuit illustrated in FIG. 13 is similar to the circuit illustrated in FIG. 9 but with an alternative compute component 1331-6 configuration including a cross-coupled latch. The dynamic latch and/or static latch of the compute component 1331-6 can be collectively referred to herein as a secondary latch, which can serve as an accumulator. As such, the compute component 1331-6 can operate as and/or be referred to herein as an accumulator. Data line D 1305-1 (e.g., on a sensing circuitry 1350 side of the shift circuitry 1323 which can correspond to shift circuitry 923 in FIG. 9) can correspond to data line D 905-1 shown in FIG. 9, data line D_ 1305-2 (e.g., on a sensing circuitry 1350 side of the shift circuitry 1323) can correspond to data line D_ 905-2 shown in FIG. 9, and sense amplifier 1306 can correspond to sense amplifier 906 shown in FIG. 9. Compute component 1331-6 can correspond to compute component 231-1 shown in FIG. 2.

The configuration and components of compute component 1331-6 shown in FIG. 13 is similar to the configuration and components of compute component 931-5 shown in FIG. 9 with the exception that a latch 1364 is added to the S1 and S2 dynamic nodes. For example, the configuration of compute component 1331-6 shown in FIG. 13 shows a first input 1317-1 of latch 1364 being directly coupled to node S2 (one source/drain region of load/pass transistor 1318-1 is also directly coupled to node S2 as shown and described with respect to FIG. 9), and a second input 1317-2 of latch 1364 being directly coupled to node S1 (one source/drain region of load/pass transistor 1318-2 is also directly coupled to node S1 as shown and described with respect to FIG. 9). Compute component 1331-6 can have feedback gain with latch 1364. As such, addition of latch 1364 can provide additional stability to the data value stored in the accumulator. As such, the addition of latch 1364 in compute component 1331-6 can improve soft error performance over that of the sensing circuitry illustrated in FIG. 9.

The sensing circuitry 1350 shown in FIG. 13 can be operated as the sensing circuitry illustrated in FIG. 9, in both pre-sensing (e.g., sense amps fired before logical operation control signal active) and post-sensing (e.g., sense amps fired after logical operation control signal active) modes with a result of a logical operation being initially stored in the sense amp. In addition, the accumulator and sense amplifier of the sensing circuitry 1350 shown in FIG. 13 can also be operated as described with respect to the timing diagrams illustrated in FIG. 14-17 below, with a result of the logical operation being initially stored in the latch of the accumulator.

The latch 1364 can be controllably enabled by coupling to an active negative control signal line 1312-1 (GND/ACCUMB) and an active positive control signal line 1312-2 ($V_{DD}$/ACCUM) rather than be configured to be continuously enabled by coupling to ground and $V_{DD}$. In various embodiments, load/pass transistors 1308-1 and 1308-2 can each having a gate coupled to one of a LOAD control signal or a PASSD/PASSDB control signal.

According to some embodiments, the gates of load/pass transistors 1318-1 and 1318-2 can be commonly coupled to a LOAD control signal. In the configuration where the gates of load/pass transistors 1318-1 and 1318-2 are commonly coupled to the LOAD control signal, transistors 1318-1 and 1318-2 can be load transistors. As previously described (e.g., with respect to FIG. 9), activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 13 is not contingent on the LOAD control signal being elevated to a voltage greater than $V_{DD}$.

According to some embodiments, the gate of load/pass transistor 1318-1 can be coupled to a PASSD control signal, and the gate of load/pass transistor 1318-2 can be coupled to a PASSDb control signal. In the configuration where the gates of load/pass transistors 1318-1 and 1318-2 are respectively coupled to one of the PASSD and PASSDb control signals, transistors 1318-1 and 1318-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 1323, as shown in FIG. 13). According to some embodiments, load/pass transistors 1318-1 and 1318-2 can be configured to accommodate the heavier loading corresponding to a pass transistor but be coupled and operated as a load transistor. Transistors 1318-1 and 1318-2 configured as pass transistors can also be utilized as load transistors. However, transistors 1318-1 and 1318-2 configured as load transistors may not be capable of being utilized as pass transistors.

In a number of embodiments, the compute component 1331-6, including the latch 1364, can comprise a number of transistors formed on pitch with the transistors of the corresponding memory cells of an array (e.g., array 230 shown in FIG. 2) to which they are coupled, which may conform to a particular feature size (e.g., $4F^2$, $6F^2$, etc.). According to various embodiments, latch 1364 includes four transistors 1308-1, 1308-2, 1309-1, and 1309-2 coupled to a pair of complementary data lines D 1305-1 and D_ 1305-2 through load/pass transistors 1318-1 and 1318-2. However, embodiments are not limited to this configuration. The latch 1364 can be a cross coupled latch (e.g., gates of a pair of transistors, such as n-channel transistors (e.g., NMOS transistors) 1309-1 and 1309-2 are cross coupled with the gates of another pair of transistors, such as p-channel transistors (e.g., PMOS transistors) 1308-1 and 1308-2). As described further herein, the cross coupled latch 1364 can be referred to as a static latch.

The voltages or currents on the respective data lines D and D_ can be provided to the respective latch inputs 1317-1 and 1317-2 of the cross coupled latch 1364 (e.g., the input of the secondary latch). In this example, the latch input 1317-1 is coupled to a first source/drain region of transistors 1308-1 and 1309-1 as well as to the gates of transistors 1308-2 and 1309-2. Similarly, the latch input 1317-2 can be coupled to a first source/drain region of transistors 1308-2 and 1309-2 as well as to the gates of transistors 1308-1 and 1309-1.

In this example, a second source/drain region of transistor 1309-1 and 1309-2 is commonly coupled to an active negative control signal line 1312-1 (e.g., ground (GND) or ACCUMB control signal similar to control signal RnIF shown in FIG. 5 with respect to the primary latch). A second source/drain region of transistors 1308-1 and 1308-2 is commonly coupled to an active positive control signal line 1312-2 (e.g., $V_{DD}$ or ACCUM control signal similar to control signal ACT shown in FIG. 5 with respect to the primary latch). The active positive control signal 1312-2 can provide a supply voltage (e.g., $V_{DD}$) and the active negative control signal 1312-1 can be a reference voltage (e.g., ground) to enable the cross coupled latch 1364. According to some embodiments, the second source/drain region of transistors 1308-1 and 1308-2 are commonly coupled directly to the supply voltage (e.g., $V_{DD}$), and the second source/drain region of transistor 1309-1 and 1309-2 are commonly coupled directly to the reference voltage (e.g., ground) so as to continuously enable latch 1364.

The enabled cross coupled latch 1364 operates to amplify a differential voltage between latch input 1317-1 (e.g., first common node) and latch input 1317-2 (e.g., second common node) such that latch input 1317-1 is driven to either the activated positive control signal voltage (e.g., $V_{DD}$) or the activated negative control signal voltage (e.g., ground), and latch input 1317-2 is driven to the other of the activated positive control signal voltage (e.g., $V_{DD}$) or the activated negative control signal voltage (e.g., ground).

One source/drain region of each of transistors 1307-1, 1307-2, 1314-1, and 1314-2 can be commonly coupled together to a reference voltage location 1391-1 (e.g., ground (GND)) so as to be configured as pull-down transistors. Inverting transistors that pull-down a respective data line in performing certain logical operations, including transistor 1316-1 (having a gate coupled to S2 of the dynamic latch and latch 1364) in series with transistor 1314-1 (having a gate coupled to an ANDinv control signal line 1313-1), and transistor 1316-2 (having a gate coupled to S1 of the dynamic latch and latch 1364) in series with transistor 1314-2 (having a gate coupled to an ANDinv control signal line 1313-2) can operate as described with respect to corresponding transistors shown in FIG. 9 (e.g., transistor 1316-1 shown in FIG. 13 corresponds to transistor 916-1 shown in FIG. 9, etc.).

Figure 14:
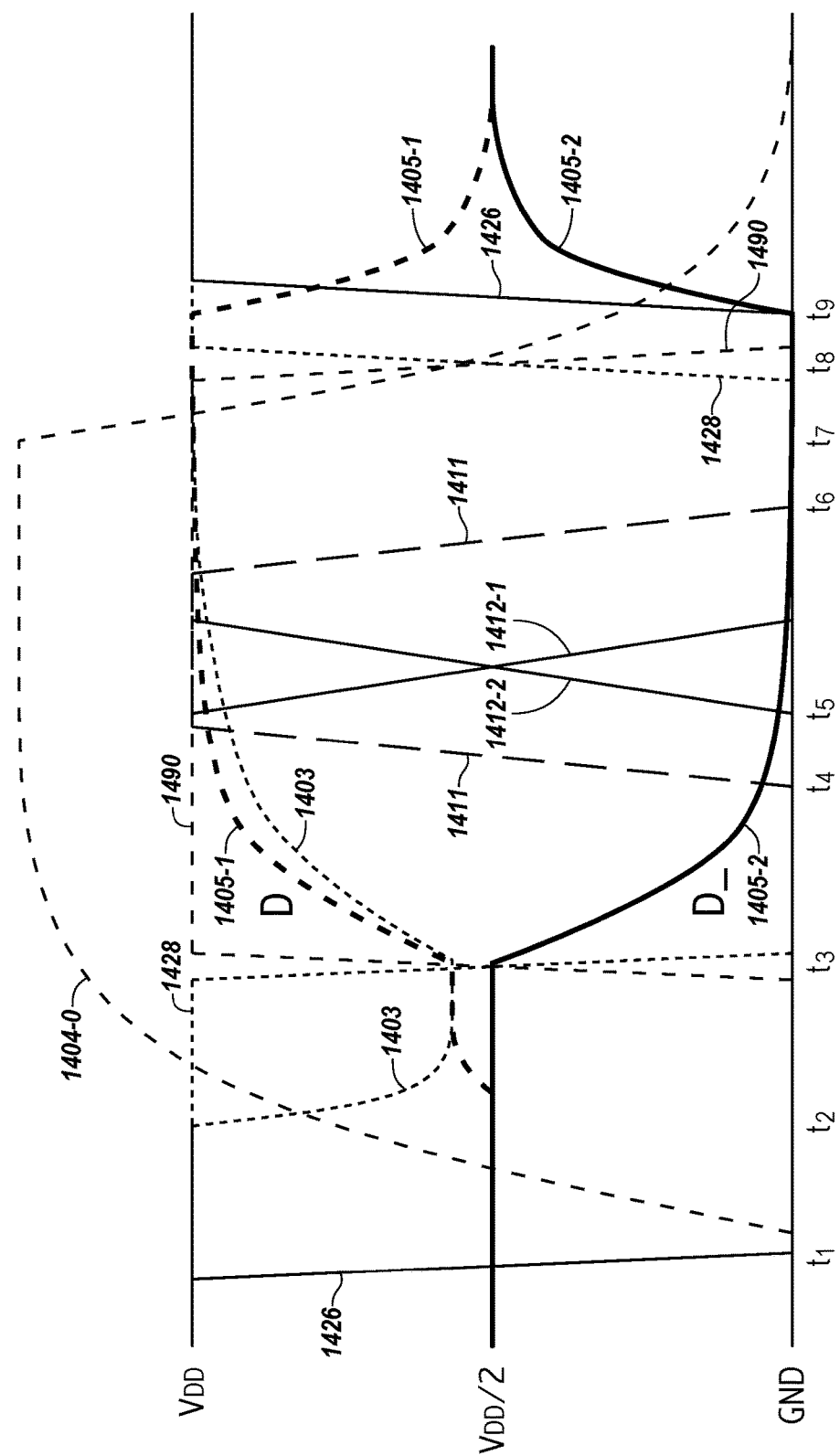
FIG. 14 illustrates a timing diagram associated with performing a number of logical operations using sensing circuitry in accordance with a number of embodiments of the present disclosure.

FIG. 14 illustrates a timing diagram associated with performing a number of logical operations using sensing circuitry in accordance with a number of embodiments of the present disclosure. The timing diagram shown in FIG. 14 illustrates signals (e.g., voltage signals) associated with performing a first operation phase of a logical operation (e.g., an R-input logical operation) using the sensing circuitry illustrated in FIG. 13. The first operation phase described with respect to FIG. 14 can be a first operation phase of an AND, NAND, OR, or NOR operation, for instance. Performing the operation phase illustrated in FIG. 14 can involve consuming significantly less energy (e.g., about half) than previous processing approaches that may involve providing a full swing between voltage rails (e.g., between a supply and ground).

In the example illustrated in FIG. 14, the voltage rails corresponding to complementary logic values (e.g., "1" and "0") are a supply voltage ($V_{DD}$) and a reference voltage (e.g., ground (GND)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 14 do not necessarily represent a same absolute or relative time as similar time references in other timing diagrams.

At time $t_1$, the equilibration signal 1426 is deactivated, and then a selected row is enabled (e.g., the row corresponding to a memory cell whose data value is to be sensed and used as a first input). Signal 1404-0 represents the voltage signal applied to the selected row (e.g., Row Y 204-Y shown in FIG. 2). When row signal 1404-0 reaches the threshold voltage (Vt) of the access transistor (e.g., 202-1 shown in FIG. 2) corresponding to the selected cell, the access transistor turns on and couples the data line D to the selected memory cell (e.g., to the capacitor 203-1 shown in FIG. 2 if the cell is a 1T1C DRAM cell), which creates a differential voltage signal between the data lines D and D_ (e.g., as indicated by signals 1405-1 and 1405-2 on the data lines, respectively) between times $t_2$ and $t_3$. The voltage of the selected cell is represented by signal 1403. Due to conservation of energy, creating the differential signal between data lines D and D_ (e.g., by coupling the cell to data line D) does not consume energy, since the energy associated with activating/deactivating the row signal 1404-0 can be amortized over the plurality of memory cells coupled to the row.

At time $t_3$, the sense amplifier (e.g., 1306 shown in FIG. 13) is enabled (e.g., a positive control signal 1431 (e.g., corresponding to ACT 590 shown in FIG. 5) goes high and the negative control signal 1428 (e.g., corresponding to RnIF 528 shown in FIG. 5) goes low), which amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line DJ, such that the sensed data value is stored in the primary latch of sense amplifier 1306. The primary energy consumption occurs in charging the data line D (1305-1) from the equilibration voltage $V_{DD}/2$ to the rail voltage $V_{DD}$. FIG. 14 shows, in example, the data line voltages 1405-1 and 1405-2 that correspond to a logic "1" being on data line D.

According to some embodiments, the primary latch of sense amplifier 1306 can be coupled to the complementary data lines D and D_ through respective pass transistors (not shown in FIG. 5 but in a similar configuration as the manner in which latch 1364 is coupled to the data lines D and D_ through pass transistors 1318-1 and 1318-2 shown in FIG. 13). The Passd control signal 1411 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 1411 applied to control lines coupled to the respective gates of the pass transistors going high). At time $t_5$, the accumulator positive control signal 1412-1 (e.g., Accumb) and the accumulator positive control signal 1412-2 (e.g., Accum) are activated via respective control lines 1312-1 and 1312-2 shown in FIG. 13. As described below, the accumulator control signals ACCUMB 1412-1 and ACCUM 1412-2 may remain activated for subsequent operation phases. As such, in this example, activating the control signals ACCUMB 1412-1 and ACCUM 1412-2 enables the secondary latch (e.g., accumulator) of compute component 1331-6 shown in FIG. 13. The sensed data value stored in sense amplifier 1306 is transferred (e.g., copied) to the secondary latch, including the dynamic latch and latch 1364.

At time $t_6$, the Passd control signal 1411 (and the Passdb control signal) goes low thereby turning off the pass transistors (if present). However, since the accumulator control signals ACCUMB 1412-1 and ACCUM 1412-2 remain activated, an accumulated result is stored (e.g., latched) in the secondary latches (e.g., accumulator). At time $t_7$, the row signal 1404-0 is deactivated, and the array sense amps are disabled at time $t_8$ (e.g., sense amplifier control signals 1428 and 1431 are deactivated).

At time $t_9$, the data lines D and D_ are equilibrated (e.g., equilibration signal 1426 is activated), as illustrated by data line voltage signals 1405-1 and 1405-2 moving from their respective rail values to the equilibration voltage ($V_{DD}/2$). The equilibration consumes little energy due to the law of conservation of energy. As described below in association with FIG. 5, equilibration can involve shorting the complementary data lines D and D_ together at an equilibration voltage, which is $V_{DD}/2$, in this example. Equilibration can occur, for instance, prior to a memory cell sensing operation.

Figure 15:
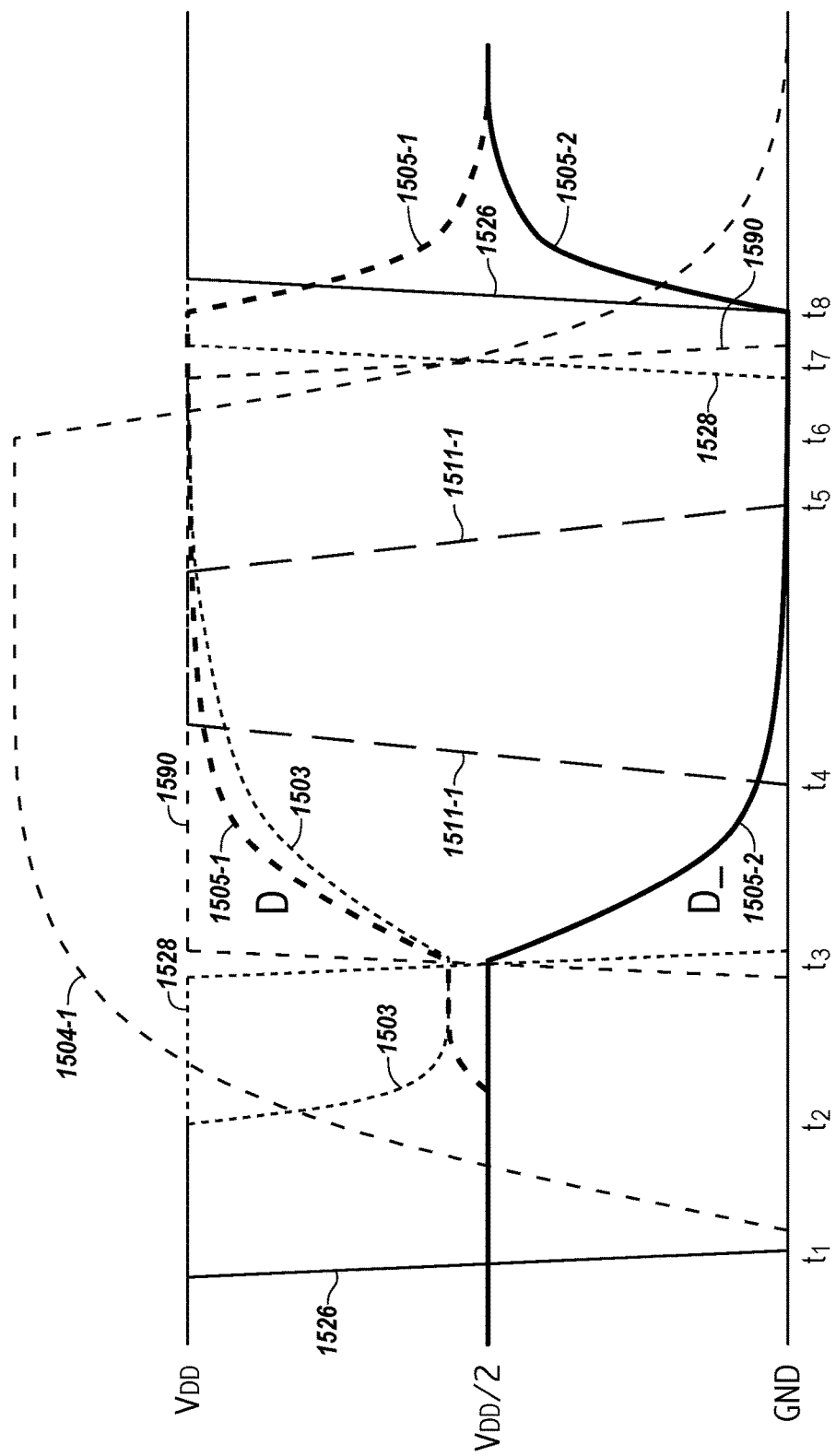
FIG. 15 illustrates a timing diagram associated with performing a number of logical operations using sensing circuitry in accordance with a number of embodiments of the present disclosure.
Figure 16:
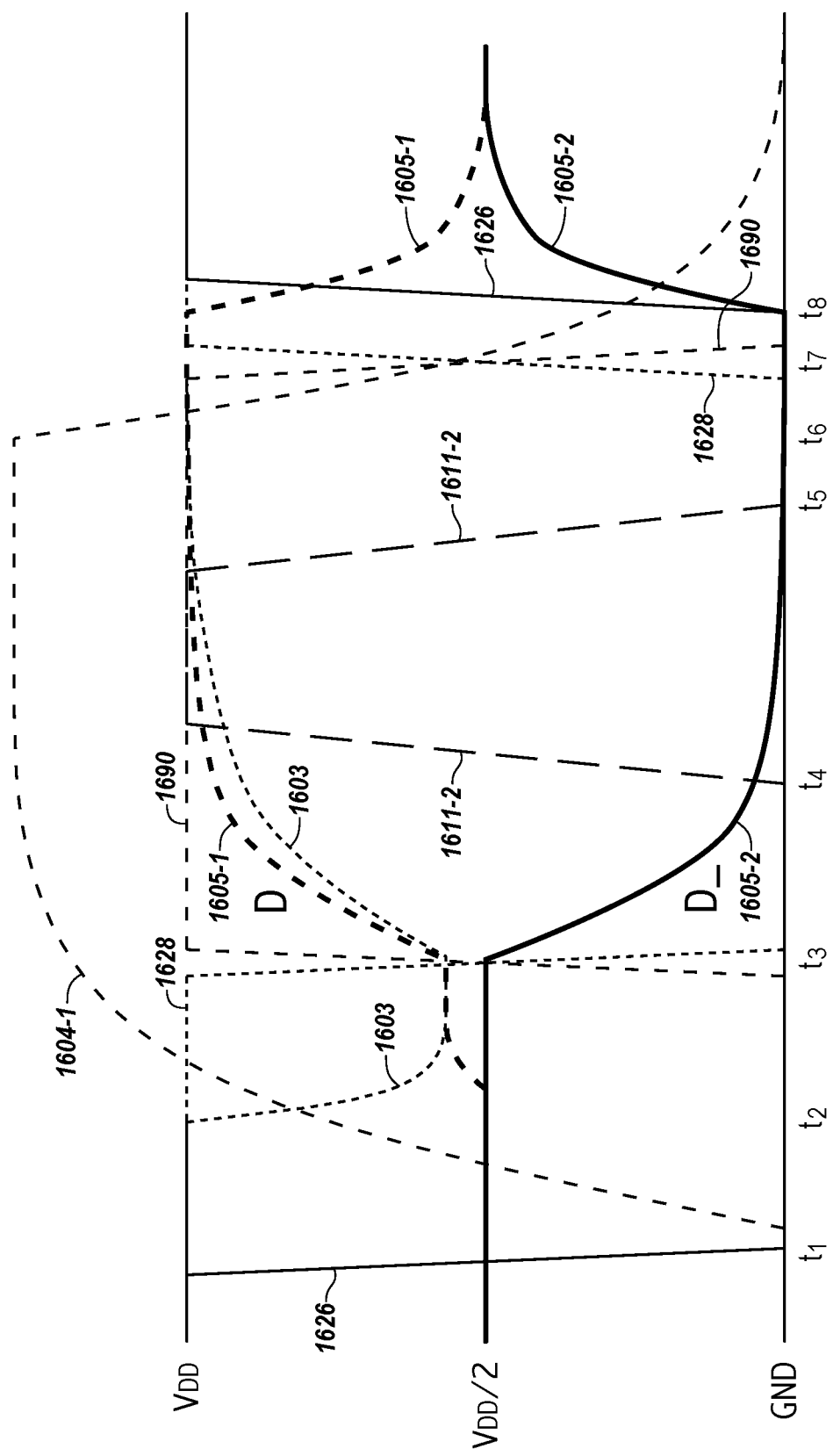
FIG. 16 illustrates a timing diagram associated with performing a number of logical operations using sensing circuitry in accordance with a number of embodiments of the present disclosure.

FIGS. 15 and 16 respectively illustrate timing diagrams associated with performing a number of logical operations using sensing circuitry in accordance with a number of embodiments of the present disclosure. Timing diagrams shown in FIGS. 15 and 16 illustrate signals (e.g., voltage signals) associated with performing a number of intermediate operation phases of a logical operation (e.g., an R-input logical operation). For instance, timing diagram shown in FIG. 15 corresponds to a number of intermediate operation phases of an R-input NAND operation or an R-input AND operation, and timing diagram shown in FIG. 16 corresponds to a number of intermediate operation phases of an R-input NOR operation or an R-input OR operation. For example, performing an AND or NAND operation can include performing the operation phase shown in FIG. 15 one or more times subsequent to an initial operation phase such as that described with respect to FIG. 14. Similarly, performing an OR or NOR operation can include performing the operation phase shown and described with respect to FIG. 16 one or more times subsequent to an initial operation phase such as that described with respect to FIG. 14.

As shown in the timing diagrams illustrated in FIGS. 15 and 16, at time $t_1$, equilibration is deactivated (e.g., the equilibration signal 1526/1626 is deactivated), and then a selected row is enabled (e.g., the row corresponding to a memory cell whose data value is to be sensed and used as an input such as a second input, third input, etc.). Signal 1504-1/1604-1 represents the voltage signal applied to the selected row (e.g., Row Y 204-Y shown in FIG. 2). When row signal 1504-1 reaches the threshold voltage (Vt) of the access transistor (e.g., 202-1 shown in FIG. 2) corresponding to the selected cell, the access transistor turns on and couples the data line D to the selected memory cell (e.g., to the capacitor 203-1 if the cell is a 1T1C DRAM cell), which creates a differential voltage signal between the data lines D and D_ (e.g., as indicated by signals 1505-1/1605-1 and 1505-2/1605-2, respectively) between times $t_2$ and $t_3$. The voltage of the selected cell is represented by signal 1503/1603. Due to conservation of energy, creating the differential signal between D and D_ (e.g., by coupling the cell to data line D) does not consume energy, since the energy associated with activating/deactivating the row signal 1504-1/1604-1 can be amortized over the plurality of memory cells coupled to the row.

At time $t_3$, the sense amplifier (e.g., 1306 shown in FIG. 13) is enabled (e.g., a positive control signal 1590/1690, which can correspond to ACT 533 shown in FIG. 5, goes high, and the negative control signal 1528/1628, which can correspond to RnIF 528 shown in FIG. 5, goes low), which amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line DJ, such that the sensed data value is stored in the primary latch of sense amplifier 1306. The primary energy consumption occurs in charging the data line D (1305-1) from the equilibration voltage $V_{DD}/2$ to the rail voltage $V_{DD}$.

As shown in timing diagrams illustrated in FIGS. 15 and 16, at time $t_4$ (e.g., after the selected cell is sensed), only one of control signals 1511-1 (Passd) shown in FIGS. 15 and 1611-2 (Passdb) shown in FIG. 16 is activated (e.g., only one of pass transistors (if present) is enabled), depending on the particular logic operation. For example, since the timing diagram illustrated in FIG. 15 corresponds to an intermediate phase of a NAND or AND operation, control signal 1511-1 (Passd) is activated at time $t_4$ to turn on the pass transistor coupling the primary latch to data line D and the Passdb control signal remains deactivated leaving the pass transistor coupling the primary latch to data line D_ turned off. Conversely, since the timing diagram illustrated in FIG. 16 corresponds to an intermediate phase of a NOR or OR operation, control signal 1611-2 (Passdb) is activated at time $t_4$ to turn on the pass transistor coupling the primary latch to data line D_ and control signal Passd remains deactivated leaving the pass transistor coupling the primary latch to data line D turned off. Recall from above that the accumulator control signals 1412-1 (Accumb) and 1412-2 (Accum) were activated during the initial operation phase described with respect to FIG. 14, and they remain activated during the intermediate operation phase(s).

Since the accumulator was previously enabled, activating only Passd (1511-1 as shown in FIG. 15) results in accumulating the data value corresponding to the voltage signal 1505-1 shown in FIG. 15 corresponding to data line D. Similarly, activating only Passdb (1611-2 as shown in FIG. 16) results in accumulating the data value corresponding to the voltage signal 1605-2 corresponding to data line D_. For instance, in an example AND/NAND operation shown in the timing diagram illustrated in FIG. 15 in which only Passd (1511-1) is activated, if the data value stored in the second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 16 in which only Passdb 1611-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 1605-2 on D_ is setting the true data value of the accumulator.

At the conclusion of an intermediate operation phase such as that shown in FIG. 15 or 16, the Passd signal 1511-1 (e.g., for AND/NAND) or the Passdb signal 1611-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 15 or 16 can be repeated in order to accumulate results from a number of additional rows. As an example, the sequence of timing diagram illustrated in FIGS. 15 and/or 16 can be performed a subsequent (e.g., second) time for a third memory cell, a subsequent (e.g., third) time for a fourth memory cell, etc. For instance, for a 10-input NOR operation, the intermediate phase shown in FIG. 16 can occur 9 times to provide 9 inputs of the 10-input logical operation, with the tenth input being determined during the initial operation phase (e.g., as described with respect to FIG. 14).

Figure 17:
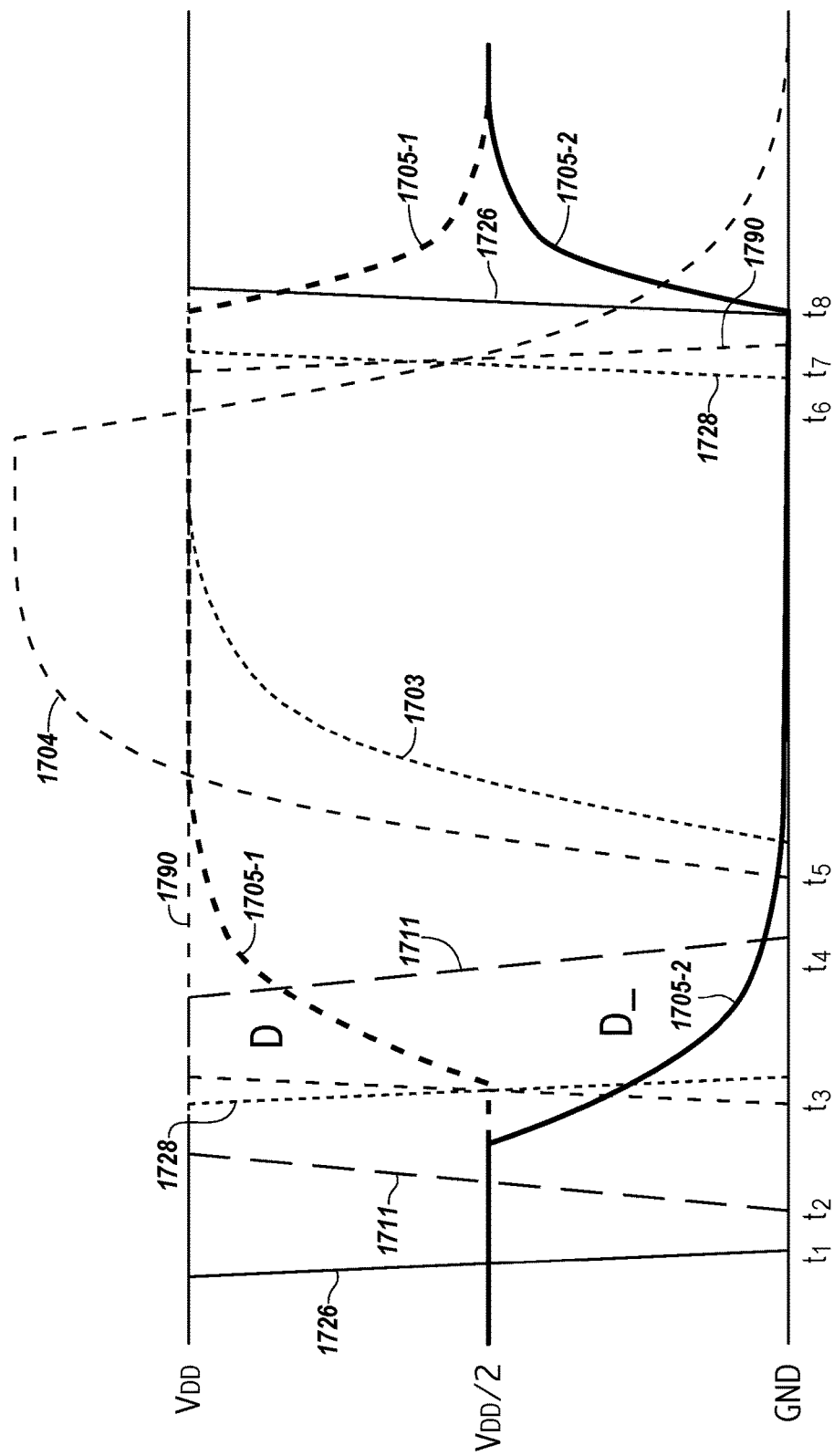
FIG. 17 illustrates a timing diagram associated with performing a number of logical operations using sensing circuitry in accordance with a number of embodiments of the present disclosure.

FIG. 17 illustrates a timing diagram associated with performing a number of logical operations using sensing circuitry in accordance with a number of embodiments of the present disclosure. The timing diagram illustrated in FIG. 17 shows signals (e.g., voltage signals) associated with performing a last operation phase of a logical operation (e.g., an R-input logical operation). For instance, the timing diagram illustrated in FIG. 17 corresponds to a last operation phase of an R-input AND operation or an R-input OR operation.

For example, performing a last operation phase of an R-input can include performing the operation phase shown in FIG. 17 subsequent to a number of iterations of the intermediate operation phase(s) described in association with FIGS. 15 and/or 16. Table 3 shown below indicates the Figures corresponding to the sequence of operation phases associated with performing a number of R-input logical operations in accordance with a number of embodiments described herein.

TABLE 3

| Operation | FIG. 14 | FIG. 15 | FIG. 16 | FIG. 17 |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 17 is described in association with storing a result of an R-input logical operation to a row of the array (e.g., array 230 shown in FIG. 2). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 17, at time equilibration is deactivated (e.g., the equilibration signal 1726 is deactivated) such that data lines D and D_ are floating. At time t2, the Passd control signal 1711 (and Passdb signal) is activated for an AND or OR operation.

Activating the Passd control signal 1711 (and Passdb signal) (e.g., in association with an AND or OR operation) transfers the accumulated output stored in the secondary latch of compute component 1331-6 shown in FIG. 13 to the primary latch of sense amplifier 1306. For instance, for an AND operation, if any of the memory cells sensed in the prior operation phases (e.g., the first operation phase illustrated in FIG. 14 and one or more iterations of the intermediate operation phase illustrated in FIG. 15) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 1306 is then enabled (e.g., a positive control signal 1731 (e.g., corresponding to ACT 590 shown in FIG. 5) goes high and the negative control signal 1728 (e.g., corresponding to RnIF 528 shown in FIG. 5) goes low), which amplifies the differential signal between data lines D and D such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 14 and one or more iterations of the intermediate operation phase shown in FIG. 16) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 1306 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2. In the examples shown in FIG. 17, the result of the R-input logical operation is stored to a memory cell coupled to the last row opened (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 17 show, at time t3, the positive control signal 1731 and the negative control signal 1728 being deactivated (e.g., signal 1731 goes high and signal 1728 goes low) to deactivate the sense amplifier 1306 shown in FIG. 13. At time t4 the Passd control signal 1711 (and Passdb signal) that was activated at time t2 is deactivated. Embodiments are not limited to this example. For instance, in a number of embodiments, the sense amplifier 1306 shown in FIG. 13 may be enabled subsequent to time t4 (e.g., after he Passd control signal 1711 (and Passdb signal) are deactivated).

As shown in FIG. 17, at time t5, a selected row is enabled (e.g., by row enabling signal 1704 going high, which drives the capacitor of the selected cell to the voltage corresponding to the logic value stored in the accumulator. At time t6 the selected row is disabled. At time t7 the sense amplifier 1306 shown in FIG. 13 is disabled (e.g., positive control signal 1728 and negative control signal 1731 are deactivated), and at time t8 equilibration occurs (e.g., signal 1726 is activated and the voltages on the complementary data lines 1705-1 (D) and 1705-2 (D_) are brought to the equilibration voltage).

Although the example of performing a last operation phase of an R-input was discussed above with respect to FIG. 17 for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 13.

Figure 18:
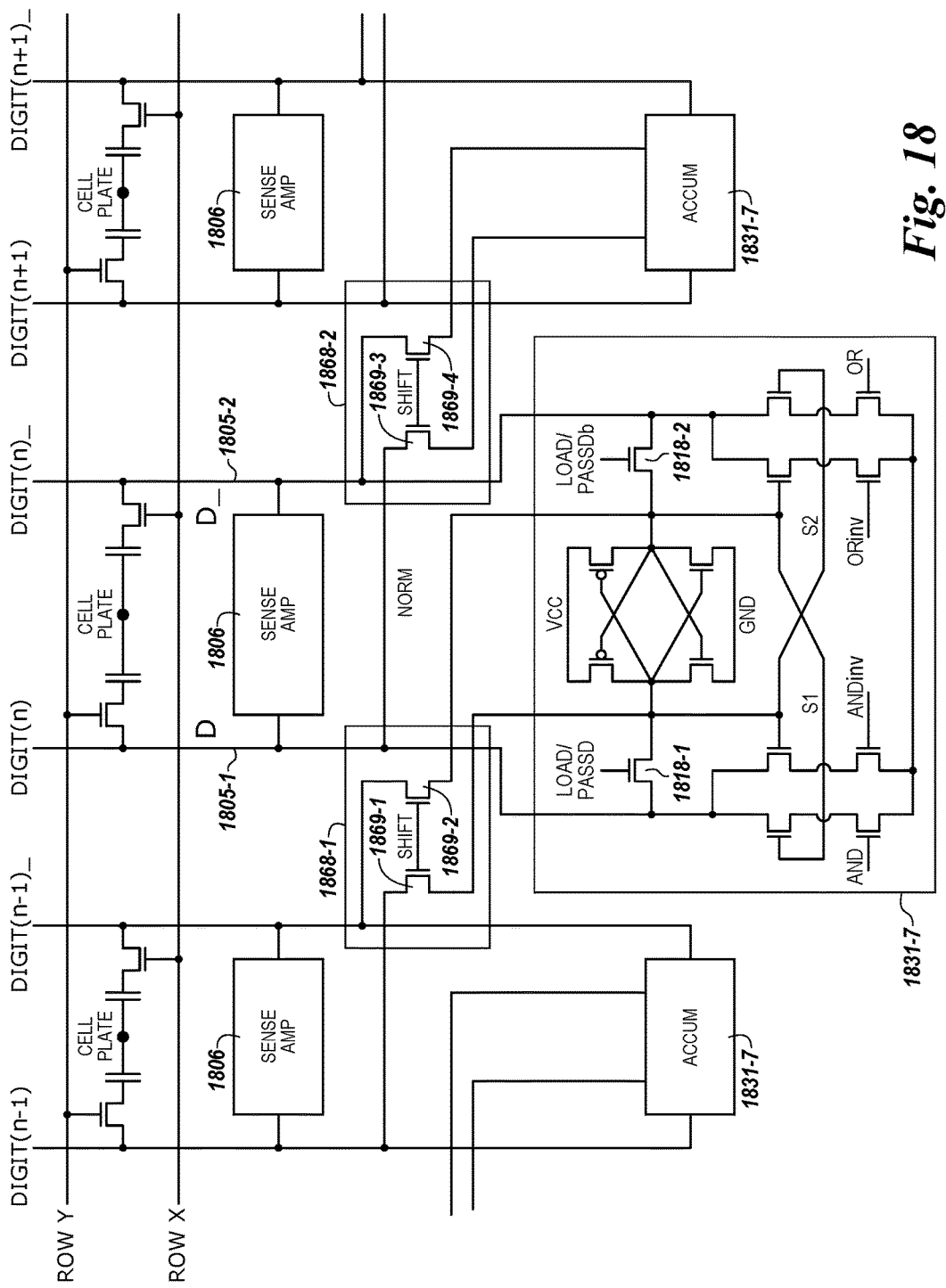
FIG. 18 is a schematic diagram illustrating sensing circuitry in accordance with a number of embodiments of the present disclosure.

FIG. 18 is a schematic diagram illustrating sensing circuitry in accordance with a number of embodiments of the present disclosure. The circuit illustrated in FIG. 18 is similar to the circuit illustrated in FIG. 13 but with an alternative configuration having a modified shift implementation, as explicitly shown in FIG. 18 (and described below). The circuit shown in FIG. 18 can include a similar or different embodiment of the configuration of the compute component 1831-7 as that shown and described with respect to compute component 1331-6 shown in FIG. 13.

According to various embodiments of the present disclosure, the configuration of the compute component 1831-7 is the same as that provided with respect to compute component 1331-6 in FIG. 13. In particular, the compute component 1831-7 can include load/pass transistors 1818-1 and 1818-2, each having a gate coupled to one of a LOAD control signal or a PASSD/PASSDB control signal. As previously described (e.g., with respect to FIG. 9), activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 9 is not contingent on the LOAD control signal being elevated to a voltage greater than $V_{DD}$.

As described with respect to FIG. 13, the compute component 1831-7 can alternatively have a transistor 1818-1 having a gate coupled to a PASSD control signal, and the compute component 1831-7 can have a transistor 1818-2 having a gate coupled to a PASSDb control signal. In the configuration where the gates of transistors 1818-1 and 1818-2 are respectively coupled to one of the PASSD and PASSDb control signals, transistors 1818-1 and 1818-2 can be pass transistors. Pass transistors can be operated differently (e.g., at different times and/or under different voltage/ current conditions) than load transistors. As such, the configuration of pass transistors can be different than the configuration of load transistors. Load transistors are constructed to handle loading associated with coupling data lines to the local dynamic nodes S1 and S2, for example. Pass transistors are constructed to handle loading associated with coupling data lines to an adjacent accumulator (e.g., through the shift circuitry 1868-1, as shown in FIG. 18).

Additionally, the circuit shown in FIG. 18 does not include a shift circuitry corresponding to shift circuitry 1323 shown in FIG. 13. The circuit shown in FIG. 18 does include shift circuitry (e.g., 1868-1, 1868-2) comprising one pair of isolation transistors. The shift circuitry 1868-1 and 1868-2 can each include a single pair of shift transistors (e.g., 1869-1 and 1869-2, 1869-3 and 1869-4).

The circuit illustrated in FIG. 18 accomplishes a SHIFT function by using the latch of the accumulator and the latch of the sense amplifier in a master-slave configuration. According to embodiments of the present disclosure, SHIFT operations (right or left) do not pre-copy the Row X data value into the accumulator. Operations to shift right a Row X data value can be summarized as follows:

Activate (e.g., Activate) Shift
Sense amplifier data is written into the accumulator one to the right.
Deactivate (e.g., Deactivate) Shift
Equilibrate (EQ) data lines
Deactivate EQ
Activate Passd and Passdb
Fire Sense Amps (after which shifted data resides in the sense amps)
Deactivate Passd and Passdb The "Activate Shift" shown in the pseudo code above indicates that the SHIFT control signal goes high, which causes the shift transistors (e.g., 1869-1 and 1869-2, 1869-3 and 1869-4) to conduct to couple an adjacent pair of complementary data lines to the dynamic latch (and cross-coupled latch) of the accumulator and the sense amplifier 1806. The pair of complementary data lines corresponding to the compute component 1831-7 (e.g., D 1805-1 and D_ 1805-2) are isolated from compute component 1831-7 because transistors 1818-1 and 1818-2 are not conducting.

After the shifted right Row X data value from the left adjacent pair of complementary data lines is stored in the latches of compute component 1831-7, the "Deactivate Shift" shown in the pseudo code above indicates that the SHIFT control signal goes low, which causes the shift transistors (e.g., 1869-1 and 1869-2, 1869-3 and 1869-4) to stop conducting and isolate the left adjacent pair of complementary data lines from compute component 1831-7.

Once the left adjacent pair of complementary data lines from compute component 1831-7, the "Equilibrate (EQ) data lines" shown in the pseudo code above indicates that the pairs of complementary data lines can be equilibrated in a same manner as described previously for "Precharge" pseudo code operations. After equilibrating the pairs of complementary data lines, the "Deactivate EQ" shown in the pseudo code above indicates that the equilibration signal corresponding to the sense amplifier 1806 is disabled (e.g., such that the complementary data lines D 1805-1 and D_ 1805-2 are no longer shorted to $V_{DD}/2$), as described previously.

After equilibration is complete, the data value stored in the dynamic latch (and cross-coupled latch) of the accumulator can be copied to the sense amplifier 1806. The "Activate Passd and Passdb" shown in the pseudo code above indicates that the PASSD and PASSDb control signals go high, which causes transistors 1818-1 and 1818-2 to conduct, which couples the dynamic latch (and cross-coupled latch) of the accumulator to the pair of complementary data lines D 1805-1 and D_1805-2. This places the data value stored in the dynamic latch (and cross-coupled latch) of the accumulator on the pair of complementary data lines D 1805-1 and D_ 1805-2. Thereafter, the "Fire Sense Amps" shown in the pseudo code above indicates that the data value on the pair of complementary data lines D 1805-1 and D_ 1805-2 is stored in the sense amplifier 1806, as previously described. Once the data value is stored in the sense amplifier 1806, the "Deactivate Passd and Passdb" shown in the pseudo code above indicates that the PASSD and PASSDb control signals go low, which causes transistors 1818-1 and 1818-2 to stop conducting and isolates the dynamic latch (and cross-coupled latch) of the accumulator from the pair of complementary data lines D 1805-1 and D_ 1805-2 and the sense amplifier 1806.

Operations to shift left a Row X data value can be summarized as follows:

Activate Passd and Passdb
Sense amplifier data is written into the accumulator
Deactivate Passd and Passdb
Equilibrate (EQ) data lines
Deactivate EQ
Activate (e.g., Activate) Shift
Fire Sense Amps (after which shifted data resides in the sense amps)
Deactivate (e.g., Deactivate) Shift The "Activate Passd and Passdb" shown in the pseudo code above indicates that the PASSD and PASSDb control signals go high, which causes transistors 1818-1 and 1818-2 to conduct, thereby coupling the dynamic latch (and cross-coupled latch) of the accumulator to the pair of complementary data lines D 1805-1 and D_ 1805-2 (having the Row X data value thereon). This operation places the Row X data value in the dynamic latch (and cross-coupled latch) of the accumulator from the pair of complementary data lines D 1805-1 and D_ 1805-2.

After the Row X data value is stored in the latch (and cross-coupled latch) of the accumulator, the "Equilibrate (EQ) data lines" shown in the pseudo code above indicates that the pairs of complementary data lines can be equilibrated in a same manner as described previously for "Precharge" pseudo code operations. After equilibrating the pairs of complementary data lines, the "Deactivate EQ" shown in the pseudo code above indicates that the equilibration signal corresponding to the sense amplifier 1806 is disabled (e.g., such that the complementary data lines D 1805-1 and D_ 1805-2 are no longer shorted to $V_{DD}/2$), as described previously.

After equilibration is complete, the "Activate Shift" shown in the pseudo code above indicates that the SHIFT control signal goes high, which causes the shift transistors (e.g., 1869-1 and 1869-2, 1869-3 and 1869-4) to conduct coupling a right adjacent pair of complementary data lines to the dynamic latch (and cross-coupled latch) of the accumulator and the sense amplifier 1806. The pair of complementary data lines corresponding to the compute component 1831-7 (e.g., D 1805-1 and D_ 1805-2) are isolated from compute component 1831-7 because transistors 1818-1 and 1818-2 are not conducting.

Once the dynamic latch (and cross-coupled latch) of the accumulator are coupled to the right adjacent pair of complementary data lines, the "Fire Sense Amps" shown in the pseudo code above indicates that the data value on the right adjacent pair of complementary data lines is stored in the sense amplifier 1806, in a manner previously described for storing a data value in a sense amp.

After the shifted left Row X data value from the right adjacent pair of complementary data lines is stored in the sense amplifier 1806, the "Deactivate Shift" shown in the pseudo code above indicates that the SHIFT control signal goes low, which causes the shift transistors (e.g., 1869-1 and 1869-2, 1869-3 and 1869-4) to stop conducting and isolate the right adjacent pair of complementary data lines from compute component 1831-7.

After the shifted left Row X data value from the right adjacent pair of complementary data lines is stored in the sense amplifier 1806, the "Deactivate Shift" shown in the pseudo code above indicates that the SHIFT control signal goes low, which causes the shift transistors (e.g., 1869-1 and 1869-2, 1869-3 and 1869-4) to stop conducting and isolate the right adjacent pair of complementary data lines from compute component 1831-7 and sense amplifier 1806.

The above-described shift cycle is faster than previously-described shift cycles since a Row cycle can be eliminated. Power can be reduced because a Row is not opened; thus, there is no associated charging and discharging of the memory cells. Power can also be reduced from the circuit configuration shown in FIG. 13 with a shift circuitry 1323 because an elevated voltage (e.g., 3.0 V) is applied to the isolation transistors of the shift circuitry (e.g., 221-1, 221-2, 221-3, 221-4 shown in FIG. 2), whereas $V_{DD}$ (e.g., 1.2 V) is utilized in implementing SHIFT functionality using the circuit illustrated in FIG. 18.

While example embodiments including various combinations and configurations of sensing circuitry, sense amps, compute component, dynamic latches, isolation devices, and/or shift circuitry have been illustrated and described herein, embodiments of the present disclosure are not limited to those combinations explicitly recited herein. Other combinations and configurations of the sensing circuitry, sense amps, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. A system, comprising:
   a memory device comprising an array of memory cells coupled to sensing circuitry; and
   control circuitry configured to operate the array and sensing circuitry to perform logical operations without enabling column decode lines;
   wherein the sensing circuitry comprises:
      a sense amplifier coupled to a pair of complementary sense lines corresponding to a column of the array; and
      a compute component coupled to the sense amplifier and comprising a dynamic latch; and
   wherein the control circuitry is configured to:
      activate a selected logical operation control signal corresponding to a selected logical operation;
      wherein activation of the selected logical operation control signal causes a result of the selected logical operation between a data value residing in the dynamic latch and a data value residing in a latch of the sense amplifier to be stored initially in the latch of the sense amplifier by overwriting the data value residing in the latch of the sense amplifier or leaving the data value residing in the latch of the sense amplifier unchanged depending on the selected logical operation; and
   wherein:
      the compute component comprises:
         a first source/drain region of a first transistor coupled to a first one of the pair of complementary sense lines and directly coupled to a first source/drain region of a first load transistor; and
a first source/drain region of a second transistor coupled to a second one of the pair of complementary sense lines and directly coupled to a first source/drain region of a second load transistor; and
wherein, prior to activating the selected logical operation control signal, the load transistor is enabled to transfer a data value residing in the latch of the sense amplifier to the dynamic latch.

2. The system of claim 1, wherein the compute component is formed on pitch with memory cells of the array.

3. The system of claim 1, wherein the system further comprises a host coupled to the memory device.

4. The system of claim 3, wherein control circuitry is local to the memory device.

5. The system of claim 4, wherein the host includes a number of processing resources.

6. The system of claim 5, wherein the number of processing resources is one processor.

7. The system of claim 1, wherein the dynamic latch of the compute component is the only latch of the compute component.

8. The system of claim 7, wherein the latch of the sense amplifier is the only latch of the sense amplifier.

9. The system of claim 8, wherein:
prior to activating the selected logical operation control signal, the data value residing in the dynamic latch corresponds to a first input of the selected logical operation and the data value residing in the latch of the sense amplifier corresponds to a second input of the selected logical operation; and
subsequent to activating the selected logical operation control signal, the result of the selected logical operation resides in the latch of the sense amplifier.

10. The system of claim 1, wherein the selected logical operation control signal is one of a plurality of logical operation control signals including at least a first control signal activated to perform a logical AND operation and a second control signal activated to perform a logical OR operation.

11. A method, comprising:
loading a first data value to a dynamic latch of a compute component coupled to an array of memory cells via a pair of complementary sense lines, wherein loading the first data value includes activating a first control signal associated with a load transistor of the compute component;
storing a second data value in a latch of a sense amplifier coupled to the compute component via the pair of complementary sense lines;
performing a selected logical operation using the first data value and the second data value as inputs to the selected logical operation, wherein performing the selected logical operation includes activating a second control signal associated with the selected logical operation; and
wherein activating the second control signal causes a result of the selected logical operation to be stored initially in the latch of the sense amplifier by overwriting the second data value residing in the latch of the sense amplifier or leaving the second data value residing in the latch of the sense amplifier unchanged depending on the selected logical operation.

12. The method of claim 11, including performing the selected logical operation without transferring data via enabling of column decode lines corresponding to the array.

13. The method of claim 11, wherein the array is local to a memory device coupled to a host, and wherein the method further comprises performing the selected logical operation responsive to receiving an instruction from the host.

14. The method of claim 11, wherein the method comprises, prior to storing the second data value in the latch of the sense amplifier:
storing the first data value in the latch of the sense amplifier; and
transferring the first data value from the latch of the sense amplifier to the dynamic latch of the compute component.

15. A system, comprising:
a memory device comprising:
an array comprising a plurality of complementary sense line pairs corresponding to respective columns of memory cells;
sensing circuitry comprising a plurality of sense amplifier and compute component pairs corresponding to respective columns; and
control circuitry configured to operate the array and sensing circuitry; and wherein the memory device is configured to:
load a first data value to a dynamic latch of a compute component of a particular sense amplifier and compute component pair, wherein loading the first data value includes activating a first control signal associated with a load transistor of the compute component;
store a second data value in a latch of a sense amplifier of the particular sense amplifier and compute component pair;
perform a selected logical operation using the first data value and the second data value as inputs to the selected logical operation, wherein performing the selected logical operation includes activating a second control signal associated with the selected logical operation; and
wherein activating the second control signal causes a result of the selected logical operation to be stored initially in the latch of the sense amplifier by overwriting the second data value residing in the latch of the sense amplifier or leaving the second data value residing in the latch of the sense amplifier unchanged depending on the selected logical operation.

16. The system of claim 15, wherein the latch of each compute component comprises a dynamic latch with the dynamic latch being the only latch of the compute components.

17. The system of claim 15, wherein the memory device is configured to perform the selected operation, in parallel, without enabling column decode lines of the array.

18. A system, comprising:
a memory device comprising an array of memory cells coupled to sensing circuitry; and
control circuitry configured to operate the array and sensing circuitry to perform logical operations without enabling column decode lines;
wherein the sensing circuitry comprises:
a sense amplifier coupled to a pair of complementary sense lines corresponding to a column of the array; and
a compute component coupled to the sense amplifier and comprising a dynamic latch; and
wherein the control circuitry is configured to:
activate a selected logical operation control signal corresponding to a selected logical operation;

wherein activation of the selected logical operation control signal causes a result of the selected logical operation between a data value residing in the dynamic latch and a data value residing in a latch of the sense amplifier to be stored initially in the latch of the sense amplifier by overwriting the data value residing in the latch of the sense amplifier or leaving the data value residing in the latch of the sense amplifier unchanged depending on the selected logical operation; and wherein the compute component comprises:
- a first source/drain region of a first transistor coupled to a first one of the pair of complementary sense lines and to a first source/drain region of a first load transistor;
- a first source/drain region of a second transistor coupled to a second one of the pair of complementary sense lines and to a first source/drain region of a second load transistor;
- a second source/drain region of the first transistor coupled to a first source/drain region of a first dynamic latch transistor; and
- a second source/drain region of the second transistor coupled to a first source/drain region of a second dynamic latch transistor.

19. A system, comprising:

a memory device comprising an array of memory cells coupled to sensing circuitry; and control circuitry configured to operate the array and sensing circuitry to perform logical operations without enabling column decode lines;

wherein the sensing circuitry comprises:
- a sense amplifier coupled to a pair of complementary sense lines corresponding to a column of the array; and
- a compute component coupled to the sense amplifier and comprising a dynamic latch; and wherein the control circuitry is configured to:
- activate a selected logical operation control signal corresponding to a selected logical operation;
- wherein activation of the selected logical operation control signal causes a result of the selected logical operation between a data value residing in the dynamic latch and a data value residing in a latch of the sense amplifier to be stored initially in the latch of the sense amplifier by overwriting the data value residing in the latch of the sense amplifier or leaving the data value residing in the latch of the sense amplifier unchanged depending on the selected logical operation; and wherein the compute component further comprises:
- a second source/drain region of the first dynamic latch transistor coupled to the first one of the complementary pair of sense lines;
- a second source/drain region of the second dynamic latch transistor coupled to the second one of the complementary pair of sense lines;
- a gate of the first dynamic latch transistor coupled to a second source/drain region of the second load transistor;
- a gate of the second dynamic latch transistor coupled to a second source/drain region of the first load transistor; and
- a gate of the first load transistor coupled to a gate of the second load transistor.

* * * * *